US008525251B2

United States Patent
Hagishima et al.

(10) Patent No.: US 8,525,251 B2
(45) Date of Patent: Sep. 3, 2013

(54) NONVOLATILE PROGRAMMABLE LOGIC SWITCH

(75) Inventors: Daisuke Hagishima, Kawasaki (JP);
Atsuhiro Kinoshita, Kamakura (JP);
Kazuya Matsuzawa, Tokyo (JP);
Kazutaka Ikegami, Tokyo (JP);
Yoshifumi Nishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 13/221,292

(22) Filed: Aug. 30, 2011

(65) Prior Publication Data
US 2012/0080739 A1    Apr. 5, 2012

Related U.S. Application Data

(63) Continuation of application No. PCT/JP2010/051799, filed on Feb. 8, 2010.

(30) Foreign Application Priority Data

Mar. 26, 2009 (JP) ................................ 2009-075972

(51) Int. Cl.
*H01L 29/792* (2006.01)
(52) U.S. Cl.
USPC .......................................... 257/324; 257/314
(58) Field of Classification Search
USPC ................................................ 257/324, 314
See application file for complete search history.

(56) References Cited

U.S. PATENT DOCUMENTS

| 6,072,720 | A | 6/2000 | Peng et al. |
| 6,531,887 | B2 | 3/2003 | Sun et al. |
| 7,368,789 | B1 * | 5/2008 | Dhaoui et al. ............... 257/369 |
| 7,430,137 | B2 | 9/2008 | Greene et al. |

(Continued)

FOREIGN PATENT DOCUMENTS

| JP | 7-183385 | 7/1995 |
| JP | 9-83349 | 3/1997 |

(Continued)

OTHER PUBLICATIONS

International Preliminary Report on Patentability and Written Opinion issued Oct. 18, 2011 in PCT/JP2010/051799.

(Continued)

*Primary Examiner* — Douglas Menz
(74) *Attorney, Agent, or Firm* — Oblon, Spivak, McClelland, Maier & Neustadt, L.L.P.

(57) ABSTRACT

A nonvolatile programmable logic switch according to an embodiment includes: a memory cell transistor including: a first source region and a first drain region of a second conductivity type formed at a distance from each other in a first semiconductor region of a first conductivity type; a first insulating film, a charge storage film, a second insulating film, and a control gate stacked in this order and formed on the first semiconductor region between the first source region and the first drain region; a pass transistor including: a second source region and a second drain region of a second conductivity type formed at a distance from each other in a second semiconductor region of the first conductivity type; a third insulating film, a gate electrode stacked in this order and formed on the second semiconductor region between the second source region and the second drain region, the gate electrode being electrically connected to the first drain region; and an electrode for applying a substrate bias to the first and second semiconductor regions.

14 Claims, 26 Drawing Sheets

(56) References Cited

U.S. PATENT DOCUMENTS

2003/0169071 A1 9/2003 Nozawa et al.
2004/0164778 A1 8/2004 Toyoda et al.
2005/0117394 A1 6/2005 Nozawa et al.
2007/0064484 A1 3/2007 McCollum et al.

FOREIGN PATENT DOCUMENTS

| JP | 2000-200843 A | 7/2000 |
| JP | 2003-258627 A | 9/2003 |
| JP | 2009-509460 A | 3/2009 |
| WO | WO 2004/059838 A1 | 7/2004 |

OTHER PUBLICATIONS

International Search Report issued Apr. 20, 2010 in PCT/JP2010/051799 filed Feb. 8, 2010 (in English language).

Japanese Office Action issued Feb. 8, 2013, in Japan Patent Application No. 2011-505921 (with English Translation).

* cited by examiner

NONVOLATILE PROGRAMMABLE LOGIC SWITCH

CROSS-REFERENCE TO RELATED APPLICATION

This application is based upon and claims the benefit of priority from prior Japanese Patent Application No. 2009-75972 filed on Mar. 26, 2009 in Japan and PCT/JP 2010/051799 filed on Feb. 8, 2010, the entire contents of which are incorporated herein by reference.

FIELD

Embodiments described herein relate generally to a nonvolatile programmable logic switch.

BACKGROUND

A programmable logic switch is a device that controls switching on and off of a logic switch (such as a transistor) in accordance with data held in a memory. Normally, such programmable logic switches are used in an FPGA (Field Programmable Gate Array) that requires reconfigurations of logic circuits and a wiring board.

In a programmable logic switch used in an FPGA, a volatile memory such as an SRAM is used as the memory. Therefore, once the power supply is switched off, the data stored in the SRAM is erased, resulting in the need to re-read data from a separately-prepared memory region when the power supply is again switched on. Also, an SRAM is normally formed by six transistors. Therefore, in an FPGA using a large number of SRAMs, the proportion of the area occupied by the SRAMs in the FPGA chip is large. As a result, the chip area of the FPGA becomes large.

A nonvolatile programmable logic switch based on a conventional semiconductor process with high reliability has been suggested (see United States Patent Publication No. 2002/0190749, for example). In the logic switch according to United States Patent Publication No. 2002/0190749, a cell transistor that is to be a memory cell and has a floating gate is used as a pass transistor. Since data is stored in the pass transistor, the occupied area is extremely small. However, if such logic switches are incorporated into a reconfigurable circuit such as an FPGA, various kinds of problems arise due to the circuit design. For example, to use a memory cell to store data, data writing and erasing need to be performed on the cell transistor. Particularly, in an erasing operation, a high voltage is applied to the diffusion layer to be the source or the drain of the cell transistor at the time of data erasing, and the high voltage for data erasing is applied directly to the gate electrode of the transistor of the later stage. Therefore, according to United States Patent Publication No. 2002/0190749, the gate insulating film of the transistor of the later stage is made as thick as 100 to 200 nm, to prevent breaking of the transistor of the later stage.

A logic switch having memory cells and a pass transistor formed independently of each other has also been known (see U.S. Pat. No. 7,430,137, for example). In the logic switch according to U.S. Pat. No. 7,430,137, first through fourth memory cells are connected in series in this order, and the gate of the pass transistor is electrically connected to the common connection node between the second and third memory cells. In that case, the gate potential of the pass transistor is controlled by the data stored in the first and fourth memory cells, and the voltage input to each of the control gates of the first and fourth memory cells.

JP-A 7-183385 (KOKAI) discloses yet another example of a logic switch. In the logic switch according to JP-A 7-183385 (KOKAI), a resistive element and a cell transistor having a floating gate are connected in series, and the gate of a pass transistor is electrically connected to the common connection node between the resistive element and the cell transistor. The potential of the common connection node is determined by the channel resistance that varies with the data written in the memory cell, and the ratio of the potential to the resistance of the resistive element.

As will be described later, the above-mentioned United States Patent Publication No. 2002/0190749, U.S. Pat. No. 7,430,137, and JP-A 7-183385 (KOKAI) have the following problems, which were first recognized by the inventors.

According to United States Patent Publication No. 2002/0190749, the gate insulating film is thick. Therefore, to prevent short channel effects, the gate length of the transistor needs to be made larger. As a result, large-size devices need to be used, and the response speed of the entire reconfigurable circuit becomes lower. According to U.S. Pat. No. 7,430,137, at least four memory cells need to be used, and the effect to reduce the area becomes very small. According to JP-A 7-183385 (KOKAI), it is difficult to form a highly-reliable resistive element in a small area, and efficient data erasing cannot be performed.

DETAILED DESCRIPTION

Figure 1:
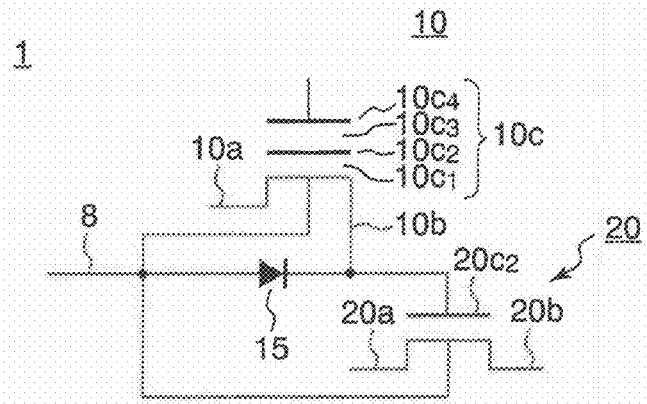
FIG. 1 is a circuit diagram of a nonvolatile programmable logic switch according to a first embodiment.

The findings made by the inventors about United States Patent Publication No. 2002/0190749, U.S. Pat. No. 7,430,137 and JP-A 7-183385 (KOKAI) are now described before a description of embodiments of the present invention is given.

According to United States Patent Publication No. 2002/0190749, the gate insulating film is thick. Therefore, to prevent short channel effects, the gate length of the transistor needs to be made larger. As a result, large-size devices need to be used, and the response speed of the entire reconfigurable circuit becomes lower. Also, the tunnel insulating film of the cell transistor needs to be made as thick as almost 8 nm to store data. In that case, the gate length of the cell transistor needs to be made larger, for the same reason as above. As described above, where a pass transistor having a large gate length is used, a high parasitic resistance exists between circuits, and signals are not easily transmitted with precision. Therefore, the memory cell and the pass transistor are provided independently of each other, so that the entire circuit can correctly operate at a high speed, though the number of transistors becomes somewhat larger.

According to U.S. Pat. No. 7,430,137, as well as the first and fourth memory cells that determine the voltage of the common connection node between the second and third memory cells, the second and third memory cells need to be prepared. This is to prevent the write and erase voltages applied to the first and fourth memory cells from breaking the gate insulating film of the pass transistor. Therefore, according to U.S. Pat. No. 7,430,137, at least four memory cells need to be used, and the effect to reduce the area becomes very small.

According to JP-A 7-183385 (KOKAI), the number of transistors is advantageously smaller than that according to U.S. Pat. No. 7,430,137. However, there are at least three technical problems with JP-A 7-183385 (KOKAI). The first problem is that it is difficult to form a highly-reliable resistive element in a small area. According to JP-A 7-183385 (KOKAI), undoped polysilicon with a high resistance value is used to form a resistive element on the diffusion layer of a memory cell. However, even if a small amount of impurities is mixed therein, the resistance value increases or decreases by several digits. Therefore, it is difficult to restrain performance variations. If a resistive element is formed from polysilicon containing a small amount of impurities, the tolerance to variations becomes higher, but formation of a resistive element in a small area becomes difficult. Secondly, JP-A 7-183385 (KOKAI) discloses a further example of a logic switch. However, in this further example of a logic switch, a transistor needs to be provided between a memory cell and a pass transistor, as in the logic switch according to U.S. Pat. No. 7,430,137. Therefore, the effect to reduce the area becomes very small. Thirdly, according to JP-A 7-183385 (KOKAI), a voltage is applied to the diffusion layer to pull out electrons at the time of erasing. However, the overlap between the floating gate and the diffusion layer is small, and efficient data erasing cannot be performed.

By taking the above findings into consideration, the inventors succeeded to obtain nonvolatile programmable logic switches each having the smallest possible size. Those nonvolatile programmable logic switches are described below as embodiments.

The following is a detailed description of the embodiments of the present invention.

A nonvolatile programmable logic switch according to an embodiment includes: a device isolation region formed in a semiconductor substrate; first and second semiconductor regions of a first conductivity type, the first and second semiconductor regions being formed in the semiconductor substrate and being separated from each other by the device isolation region; a memory cell transistor including: a first source region and a first drain region of a second conductivity type, the first source region and the first drain region being formed at a distance from each other in the first semiconductor region; a first insulating film formed on a portion of the first semiconductor region, the portion being located between the first source region and the first drain region; a charge storage film formed on the first insulating film; a second insulating film formed on the charge storage film; and a control gate formed on the second insulating film; a pass transistor including: a second source region and a second drain region of a second conductivity type, the second source region and the second drain region being formed at a distance from each other in the second semiconductor region; a third insulating film formed on a portion of the second semiconductor region, the portion being located between the second source region and the second drain region; and a gate electrode formed on the third insulating film, the gate electrode being electrically connected to the first drain region; and an electrode for applying a substrate bias to the first and second semiconductor regions, the electrode being formed in the semiconductor substrate.

(First Embodiment)

Figure 2:
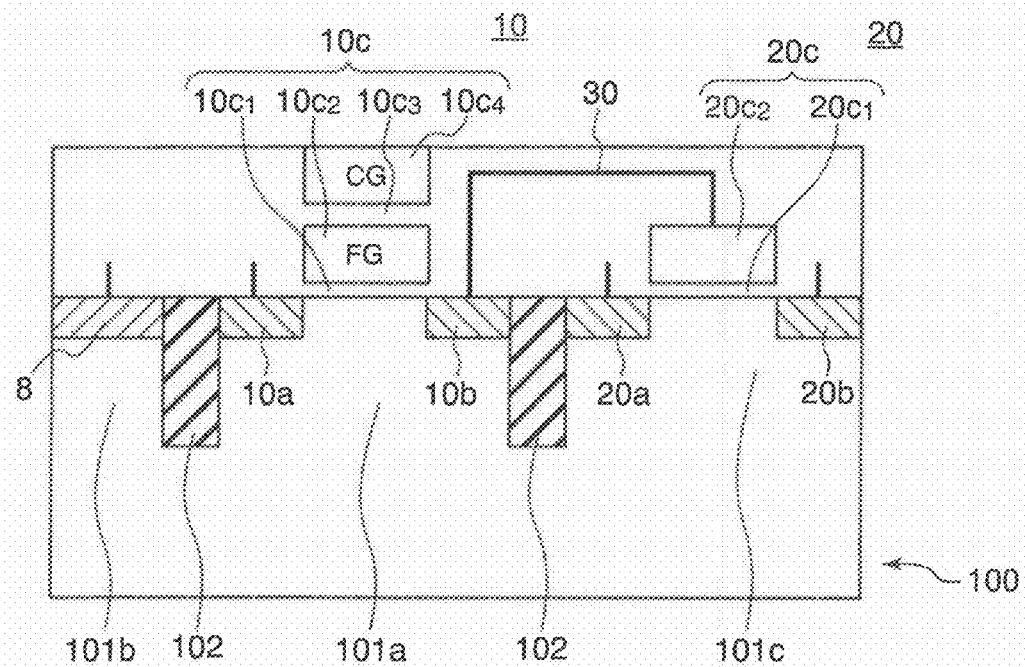
FIG. 2 is a cross-sectional view of the nonvolatile programmable logic switch according to the first embodiment.

FIG. 1 is a circuit diagram of a nonvolatile programmable logic switch (hereinafter also referred to simply as a logic switch) according to a first embodiment. FIG. 2 is a cross-sectional view of the nonvolatile programmable logic switch. The logic switch 1 of this embodiment includes a memory cell transistor 10, a diode 15, and a pass transistor 20. The memory cell transistor 10 and the pass transistor 20 are formed in p-type semiconductor regions 101a and 101c of the same semiconductor substrate 100, respectively. A $p^+$-type impurity region 8 is formed in a p-type semiconductor region 101b, and the $p^+$-type impurity region 8 serves as a terminal used for applying a substrate bias to the semiconductor substrate 100. That is, the $p^+$-type impurity region 8 only has to function as an electrode, and therefore, a metal compound such as Ni silicide may be used, instead.

The semiconductor regions 101a, 101b, and 101c are separated from one another by device isolation regions 102 made of an insulating material. Here, the semiconductor regions may be part of the semiconductor substrate or may be well regions formed in the semiconductor substrate. Alternatively, the semiconductor regions may be SOI layers of a SOI (Silicon On Insulator) substrate. The memory cell transistor 10 includes an $n^+$-type source region 10a and drain region 10b that are formed at a distance from each other in the semiconductor region 101a. A gate 10c having a stacked structure formed by stacking a tunnel insulating film $10c_1$, a charge storage film $10c_2$, a block insulating film $10c_3$, and a control gate $10c_4$ in this order is provided on the portion of the semiconductor region 101a to be the channel between the source region 10a and the drain region 10b. In this embodiment, the charge storage film $10c_2$ includes a polysilicon film, and is also called a floating gate in this case. It should be noted that the charge storage film $10c_2$ may be a charge trap film that includes an insulating material such as a silicon nitride film that can trap charges. A diode is formed by the p-type semiconductor region 101a and the $n^+$-type drain region 10b.

The pass transistor 20 includes an $n^+$-type source region 20a and drain region 20b that are formed at a distance from each other in the semiconductor region 101c. Further, a gate 20c having a stacked structure formed by stacking a gate insulating film $20c_1$ and a gate electrode $20c_2$ in this order is provided on the portion of the semiconductor region 101c to be the channel between the source region 20a and the drain region 20b.

The drain region 10b of the memory cell transistor 10 is electrically connected to the gate electrode $20c_2$ of the pass transistor 20 through an interconnect 30. A substrate bias is then applied to the memory cell transistor 10 and the pass transistor 20 through the impurity region 8.

A drive voltage $V_{DD}$ is applied to the source region 10a of the memory cell transistor 10 in operations of the pass transistor 20, or in operations other than writing and erasing operations performed on the memory cell transistor 10.

Writing data into the memory cell transistor 10 (a writing operation) is performed by applying a high positive voltage to the control gate $10c_4$ with respect to the semiconductor substrate 100 and injecting electrons into the floating gate $10c_2$ (applying a FN (Fowler-Nordheim) current from the semiconductor substrate 100 to the floating gate $10c_2$).

Erasing data from the memory cell transistor 10 (an erasing operation) is performed by applying a high positive voltage to the semiconductor substrate 100 with respect to the control gate $10c_4$ and drawing electrons out of the floating gate (applying a FN current from the floating gate to the substrate).

In the logic switch of this embodiment, the gate length of each of the memory cell transistor 10 and the pass transistor 20 is 40 nm, the thickness of the tunnel insulating film $10c_1$ of the memory cell transistor 10 is 8 nm, and the thickness of the gate insulating film $20c_1$ of the pass transistor 20 is 1.5 nm. In this description, the floating gate and the control gate are made of polysilicon, and the gate insulating film and the interlayer insulating film are silicon oxide films or silicon oxynitride films. However, the floating gate and the control gate can be metal gates (made of an nitride or carbide of Ti, Ta, Mo, W, or Rn), and the gate insulating film and the interlayer insulating film can be high-k films (insulating films having higher dielectric constants (silicon nitride films, or metal oxide films or metal oxynitride films containing a metal such as Hf or Zr)). With this structure, the EOT (Equivalent Oxide Thickness) can be made smaller, and accordingly, a more sophisticated nonvolatile programmable logic switch can be realized.

In the logic switch of this embodiment, after the memory cell transistor 10 is put into an overerased state, electrons are written into the memory cell transistor 10 as needed, so that the memory cell transistor 10 is put into a written state. The ON/OFF state (the conducting/nonconducting state) of the memory cell transistor 10 is determined by the written state of the memory cell transistor 10 (a charge stored state of the floating gate). Accordingly, the pass transistor 20 can be controlled by applying the drive voltage $V_{DD}$ to the source region 10a as described later.

Figure 3:
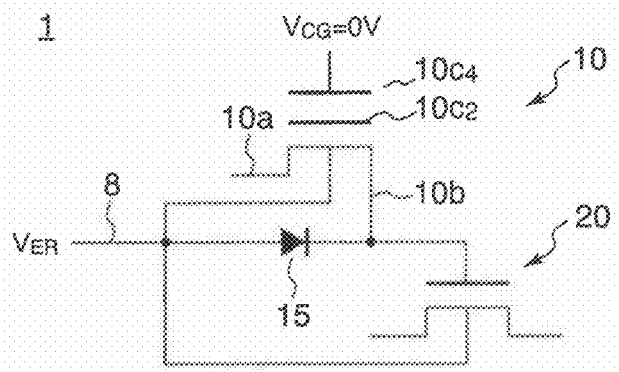
FIG. 3 is a diagram for explaining the bias condition in an erasing operation in the nonvolatile programmable logic switch according to the first embodiment.

FIG. 3 shows the bias condition in an erasing operation of the logic switch of this embodiment. A voltage $V_{CG}$ of 0 V is applied to the control gate $10c_4$, and an erase voltage $V_{ER}$ is applied to the semiconductor substrate 100 through the $p^+$-type impurity region 8, to put the source region 10a into a floating state. Accordingly, the intensity of the electrical field in the tunnel insulating film $10c_1$ between the memory cell transistor 10 and the semiconductor substrate 100 becomes higher, and electrons can be pulled out of the floating gate $10c_2$. When erasing is performed, the potential of the floating gate $10c_2$ becomes positive, and the memory cell transistor 10 is put into an ON state. At this point, it is preferable to put the source region 20a and the drain region 20b of the pass transistor 20 into a floating state, or put the substrate potentials of external circuits electrically connected to the source region 20a and the drain region 20b into a floating state. In this manner, adverse influence of the erase voltage $V_{ER}$ on the external circuits can be prevented.

As described in Background, according to Patent Documents, a transistor is interposed between a memory cell transistor and a pass transistor, or the gate insulating film of the later-stage transistor is made thicker, to prevent breakdown of surrounding transistors due to the voltage applied in an erasing operation. In the logic switch of this embodiment, however, there is no need to take any special measures. This is because the drain region 10b of the memory cell transistor is electrically connected to the gate electrode $20c_2$ of the pass transistor 20, while the semiconductor regions in which the memory cell transistor 10 and the pass transistor 20 are formed are the same p-type semiconductor regions. With this arrangement, even when the erase voltage $V_{ER}$ is applied only to the $p^+$-type impurity region 8, the erase voltage $V_{ER}$ is transmitted to both the gate electrode $20c_2$ of the pass transistor 20 and the semiconductor substrate 100, and the intensity of the electrical field in the gate insulating film $20c_1$ of the pass transistor 20 can be lowered.

Figure 4:
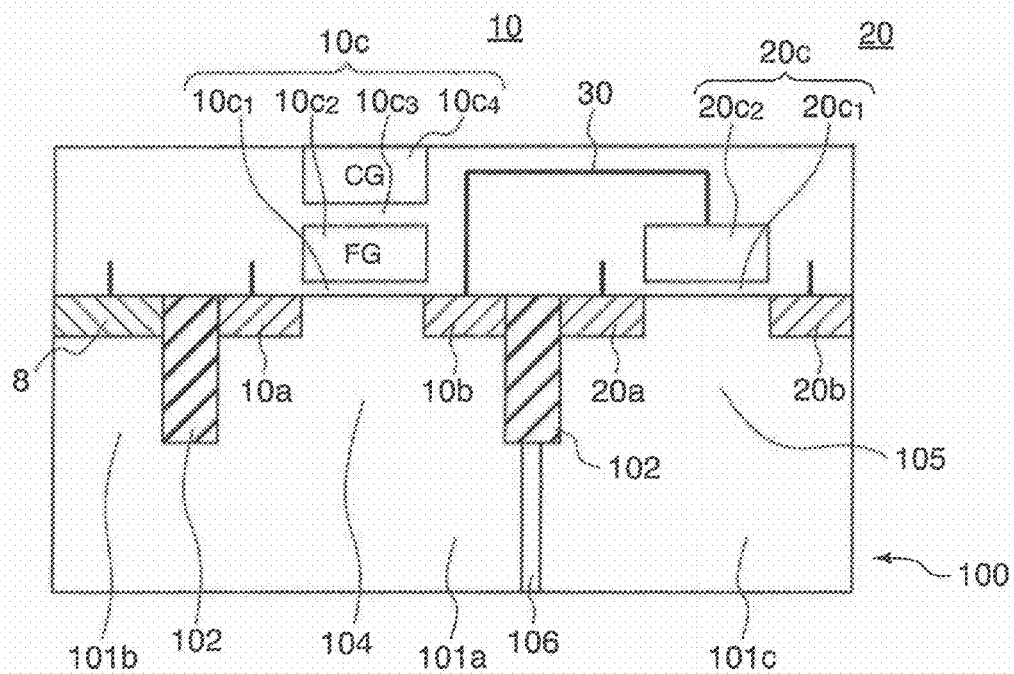
FIG. 4 is a cross-sectional view of a nonvolatile programmable logic switch according to a comparative example.

Generally, in a case where the memory cell transistor 10 and the pass transistor 20 are formed in the same chip, the memory cell transistor 10 and the pass transistor 20 are formed in blocks independent of each other. Such a structure is described below as a comparative example of a logic switch. In this comparative example of a logic switch, the memory cell transistor is formed in a memory formation region 104, and the pass transistor 20 is formed in a logic circuit formation region 105, as shown in FIG. 4. The memory formation region 104 and the logic circuit formation region 105 are separated by an n-well 106, for example. Although the n-well region 106 is shown as a narrow region, the n-well region 106 is a very wide region in reality. In the comparative example having such a structure, even if the erase voltage $V_{ER}$ is applied to the substrate of the memory cell transistor 10, the substrate potential remains grounded. Therefore, the intensity of the electrical field in the gate insulating film of the pass transistor 20 becomes extremely high.

Figure 5:
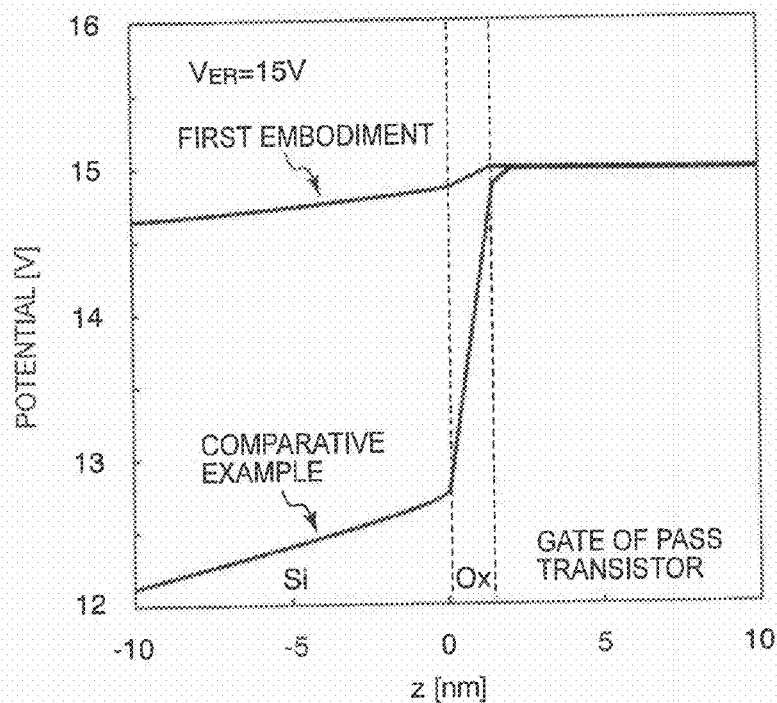
FIG. 5 is a diagram showing the potential distribution in the depth direction in the center portion of the pass transistor at the time when an erasing operation is performed.
Figure 6:
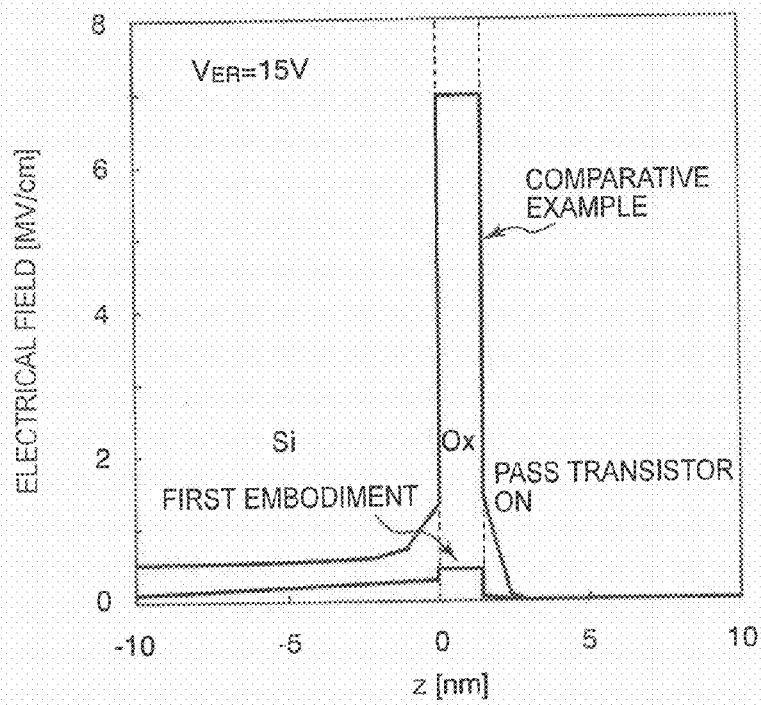
FIG. 6 is a diagram showing the electrical field distribution in the depth direction in the center portion of the pass transistor at the time when an erasing operation is performed.

FIGS. 5 and 6 show the distributions of the potentials and field intensities in the depth direction in the center portion of the pass transistor at the time when erasing operations are performed in the logic switch of this embodiment illustrated in FIG. 2 and the logic switch of the comparative example illustrated in FIG. 4. As can be seen from FIG. 5, in both this embodiment and the comparative example, the erase voltage $V_{ER}$ is transmitted to the gate electrode. However, the substrate is grounded in the comparative example. Therefore, the intensity of the electrical field in the gate insulating film becomes higher in the comparative example than in this embodiment, as can be seen from FIG. 6. In the comparative example, such a high electrical field is induced in each erasing operation, and the gate insulating film of the pass transistor may be broken. In this embodiment, on the other hand, the intensity of the electrical field induced in the gate insulating film of the pass transistor is low.

Figure 7:
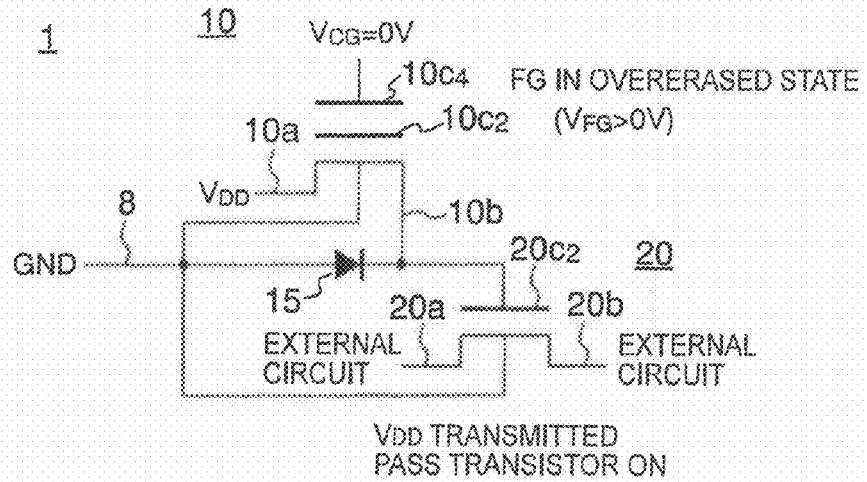
FIG. 7 is a diagram for explaining an operation performed when the pass transistor is operated in an overerased state.

FIG. 7 illustrates a case where the pass transistor 20 is operated while the memory cell transistor 10 is in an overerased state in the logic switch 1 of this embodiment. A ground potential GND is applied to the p$^+$-type impurity region 8 serving as the terminal to which the substrate bias is applied. The drive voltage $V_{DD}$ is applied to the source region 10a of the memory cell transistor 10. External circuits that are different from each other are electrically connected to the source region 20a and the drain region 20b of the pass transistor 20. The voltage $V_{CG}$ to be applied to the control gate 10c$_4$ of the memory cell transistor 10 may be arbitrarily set, but is 0 V in this example. Since the memory cell transistor 10 is in an overerased state, the drive voltage $V_{DD}$ of the source region 10a is transmitted to the gate electrode 20c$_2$ of the pass transistor 20 through the drain region 10b of the memory cell transistor 10, and the pass transistor 20 is put into an ON state. As a result, the external circuits electrically connected to the source region 20a and the drain region 20b of the pass transistor 20 are electrically connected to each other.

To put the pass transistor 20 into an OFF state, electrons should be injected into the floating gate 10c$_2$ of the memory cell transistor 10, to negatively charge the floating gate 10c$_2$.

Figure 8:
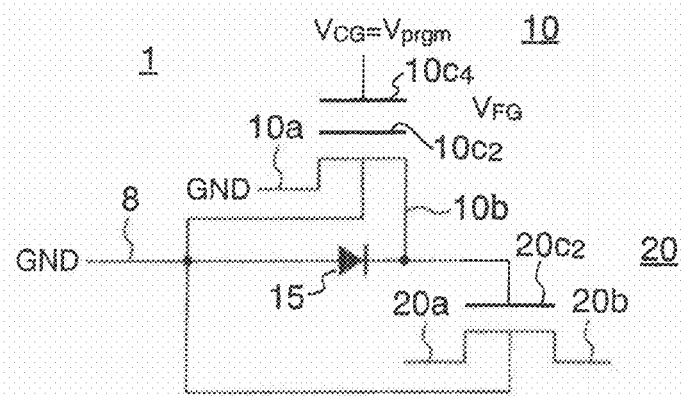
FIG. 8 is a diagram showing the bias condition in a writing operation.

FIG. 8 shows the bias condition in a writing operation in the memory cell transistor 10. Here, a write voltage (a program voltage) $V_{prgm}$ is applied to the control gate 10c$_4$, and the impurity region 8 and the source region 10a of the memory cell transistor 10 are electrically connected to GND. The source region 20a and the drain region 20b of the pass transistor 20 may be in a floating state, or may be electrically connected to external circuits. Since the intensity of the electrical field in the tunnel insulating film 10c$_1$ of the memory cell transistor 10 is made higher by applying the write voltage $V_{prgm}$ to the control gate 10c$_4$, electrons are injected from the substrate 100 into the floating gate 10c$_2$.

Figure 9:
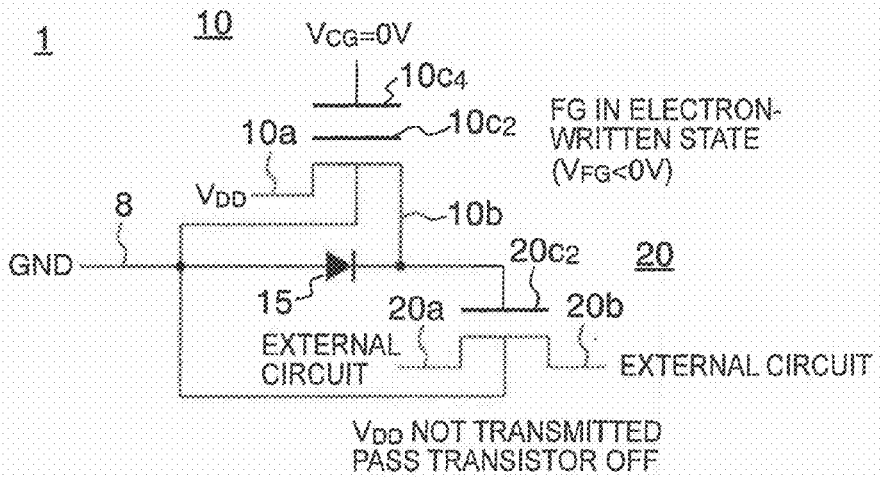
FIG. 9 is a diagram for explaining an operation performed when the pass transistor is operated after a writing operation.

FIG. 9 illustrates a situation where the pass transistor 20 is operated after a write operation is performed in the memory cell transistor 10. In this situation, the control gate 10c$_4$ is a potential of 0 V. Since electrons have been written into the memory cell transistor 10, the potential $V_{FG}$ of the floating gate 10c$_2$ becomes negative, and the memory cell transistor 10 is put into an OFF state. As a result, the drive voltage $V_{DD}$ of the source region 10a is not transmitted to the gate electrode 20c$_2$ of the pass transistor 20. Therefore, the external circuits electrically connected to the source region 20a and the drain region 20b of the pass transistor 20 are in an electrically cutoff state.

Figure 10:
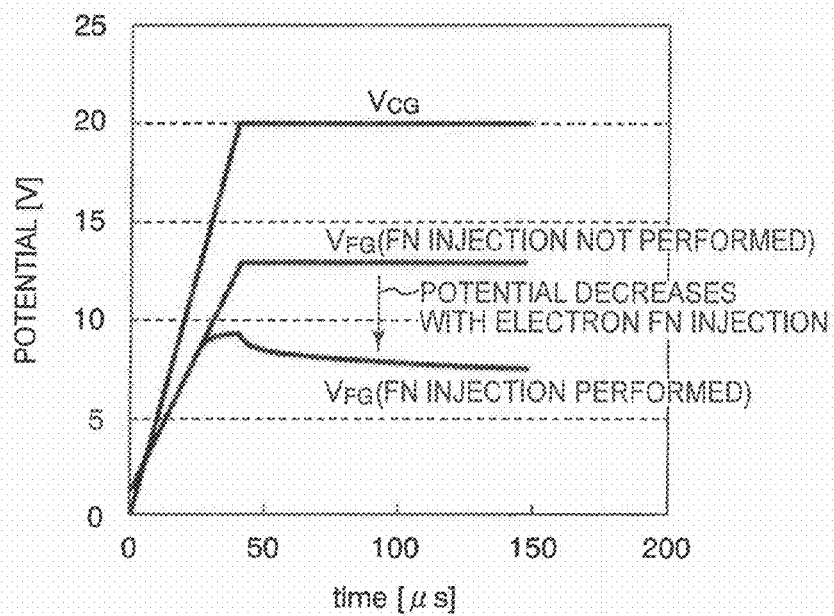
FIG. 10 is a diagram showing the results of a simulation of writing into the memory cell transistor.

To put the pass transistor 20 into a cutoff state, the potential variation caused in the floating gate 10c$_2$ by a write operation becomes important. FIG. 10 shows the results of a simulation of writing performed in the memory cell transistor 10 in the logic switch of this embodiment. In this simulation, calculations are made about a case where writing is performed at a write voltage $V_{prgm}$ of 20 V from an overerased state. In this case, the potential $V_{FG}$ of the floating gate 10c$_2$ at the time when time t is 0 is 1 V, for example. Since there is strong capacitive coupling between the control gate 10c$_4$ and the floating gate 10c$_2$ of the memory cell transistor 10 through the block insulating film 10c$_3$, the potential $V_{FG}$ of the floating gate 10c$_2$ varies with the variation of the potential $V_{CG}$ of the control gate 10c$_4$. Therefore, if there is no FN injection (injection of a FN current) into the floating gate 10c$_2$, the potential $V_{FG}$ becomes a value that is determined by the potential $V_{CG}$ and the coupling ratio. However, there is FN injection into the floating gate 10c$_2$ in reality, the potential $V_{FG}$ becomes lower with time even if the potential $V_{CG}$ is maintained at a constant value. This is because of the influence of the injected electrons, and as shown in FIG. 10, the potential $V_{FG}$ varies by −5.4 V with respect to a write time of 100 μs in this embodiment. If the potential $V_{CG}$ of the control gate 10c$_4$ is changed from $V_{prgm}$ to 0 V, the injected electrons remain stored in the floating gate 10c$_2$, and the potential $V_{FG}$ of the floating gate 10c$_2$ becomes lower. Accordingly, the potential $V_{FG}$ that is 1 V at the time when time t is 0 becomes −4.4 V after the writing (FIG. 10).

Figure 11:
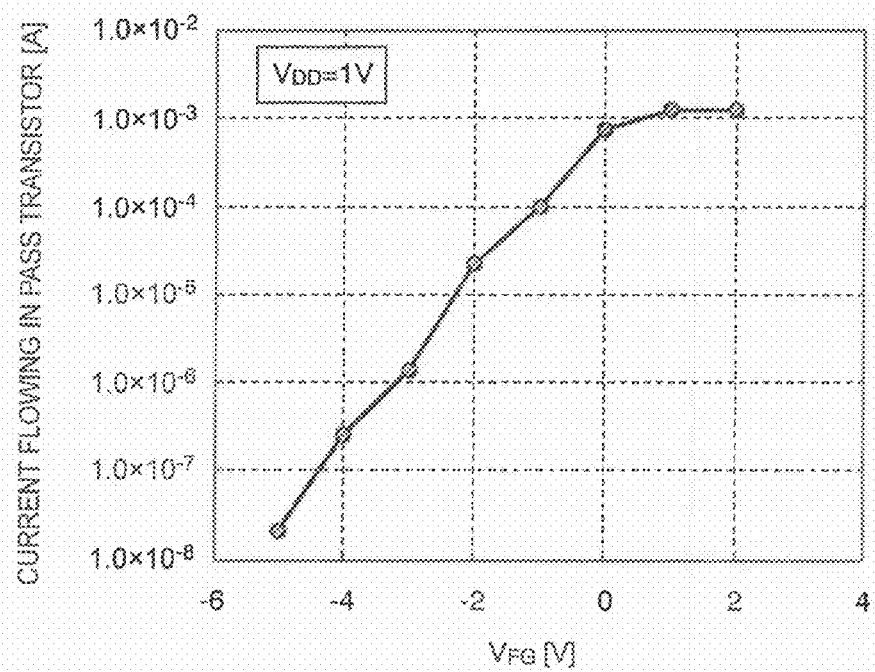
FIG. 11 is a diagram showing the switching characteristics of the nonvolatile programmable logic switch.
Figure 12:
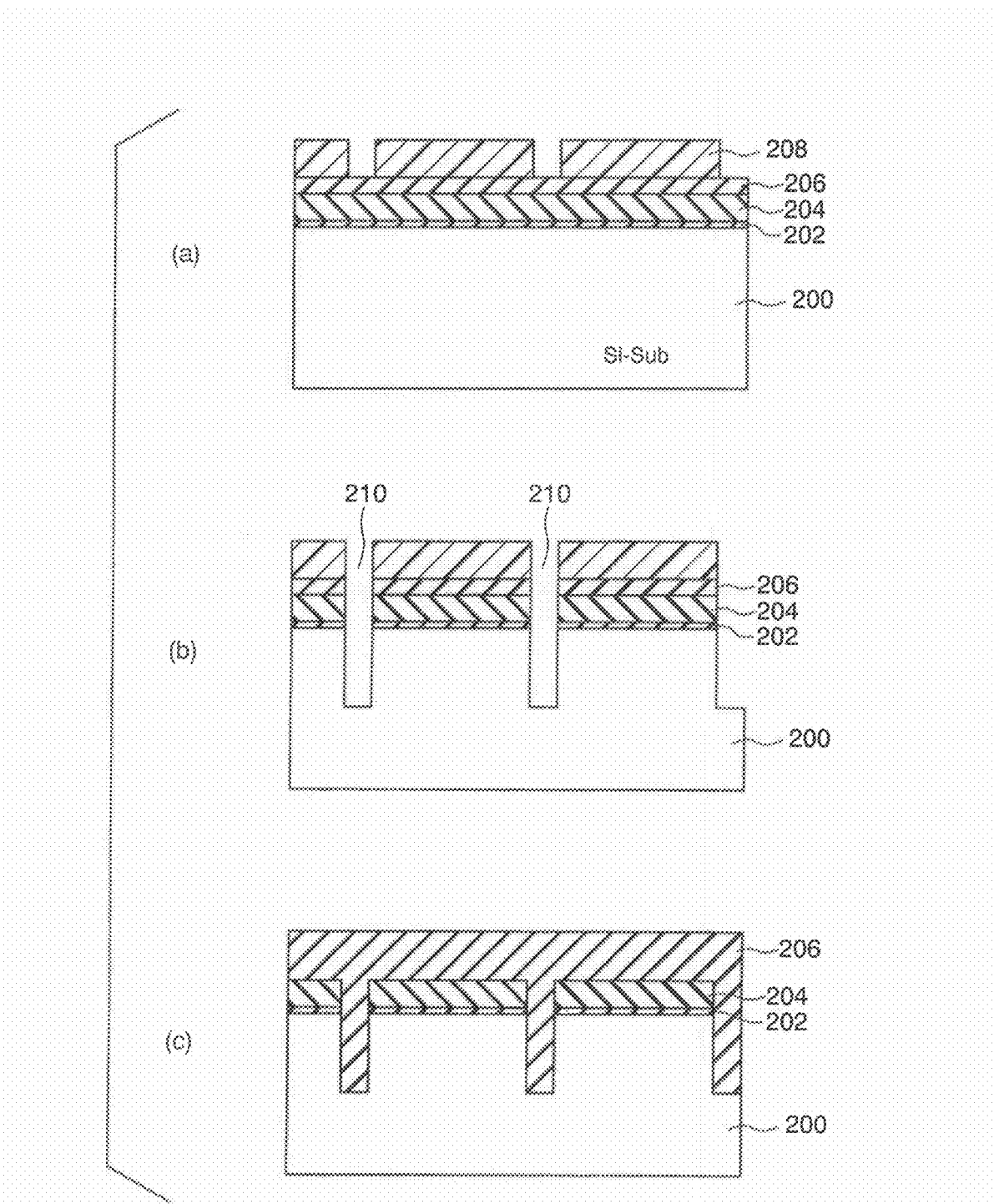
FIGS. 12(a) to 12(c) are cross-sectional views showing procedures for manufacturing the nonvolatile programmable logic switch.
Figure 13:
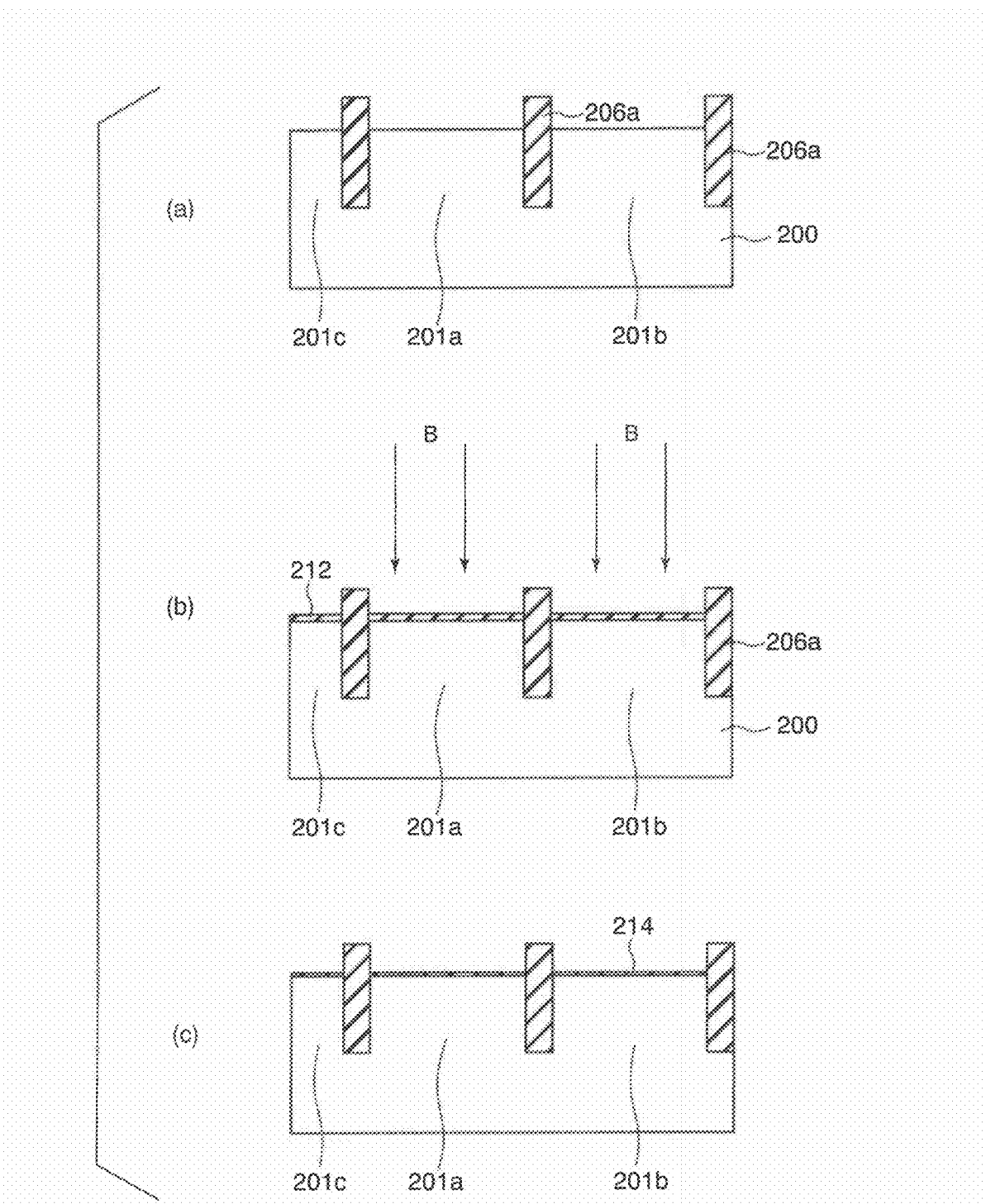
FIGS. 13(a) to 13(c) are cross-sectional views showing procedures for manufacturing the nonvolatile programmable logic switch.
Figure 14:
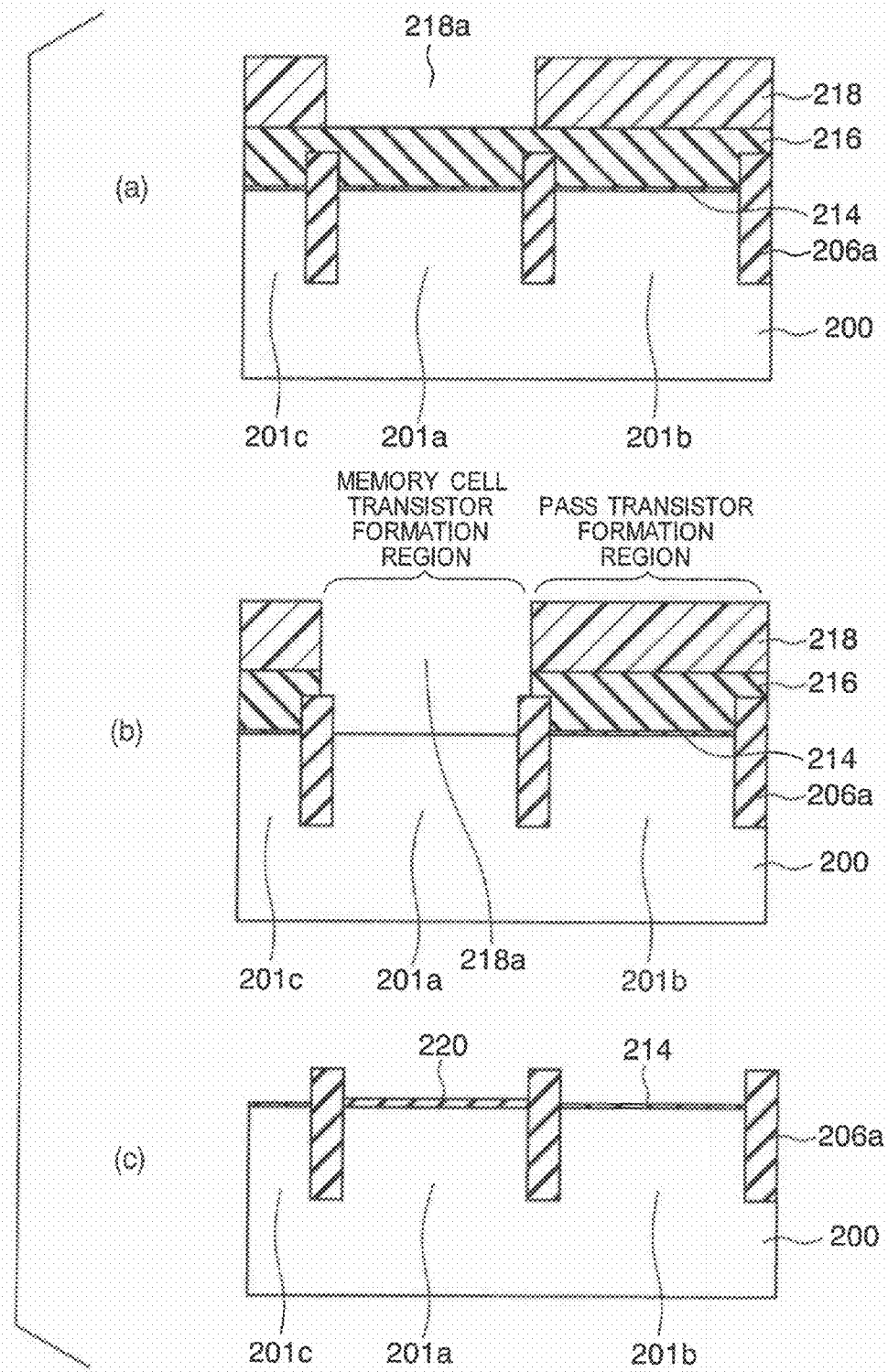
FIGS. 14(a) to 14(c) are cross-sectional views showing procedures for manufacturing the nonvolatile programmable logic switch.
Figure 15:
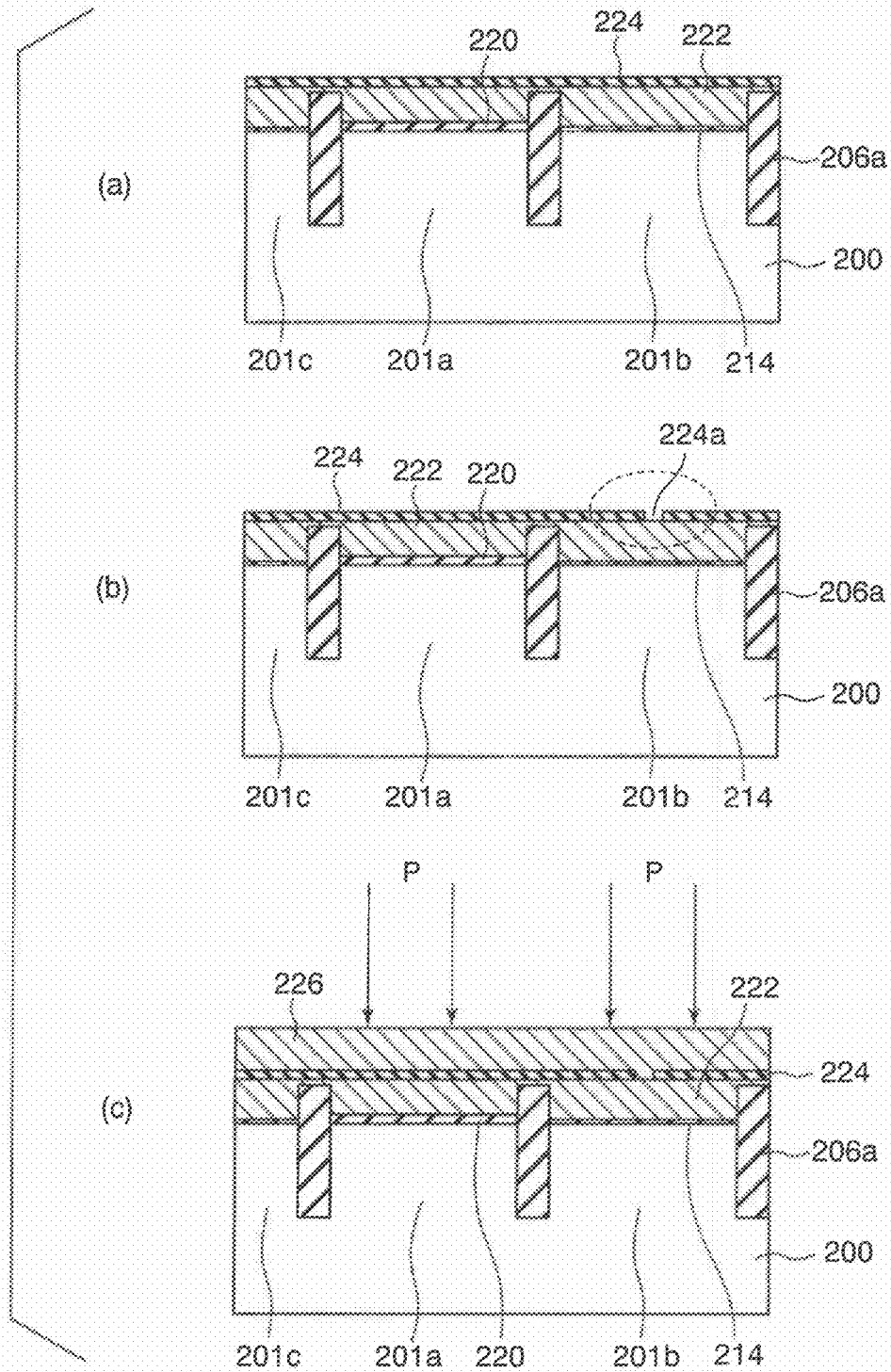
FIGS. 15(a) to 15(c) are cross-sectional views showing procedures for manufacturing the nonvolatile programmable logic switch.
Figure 16:
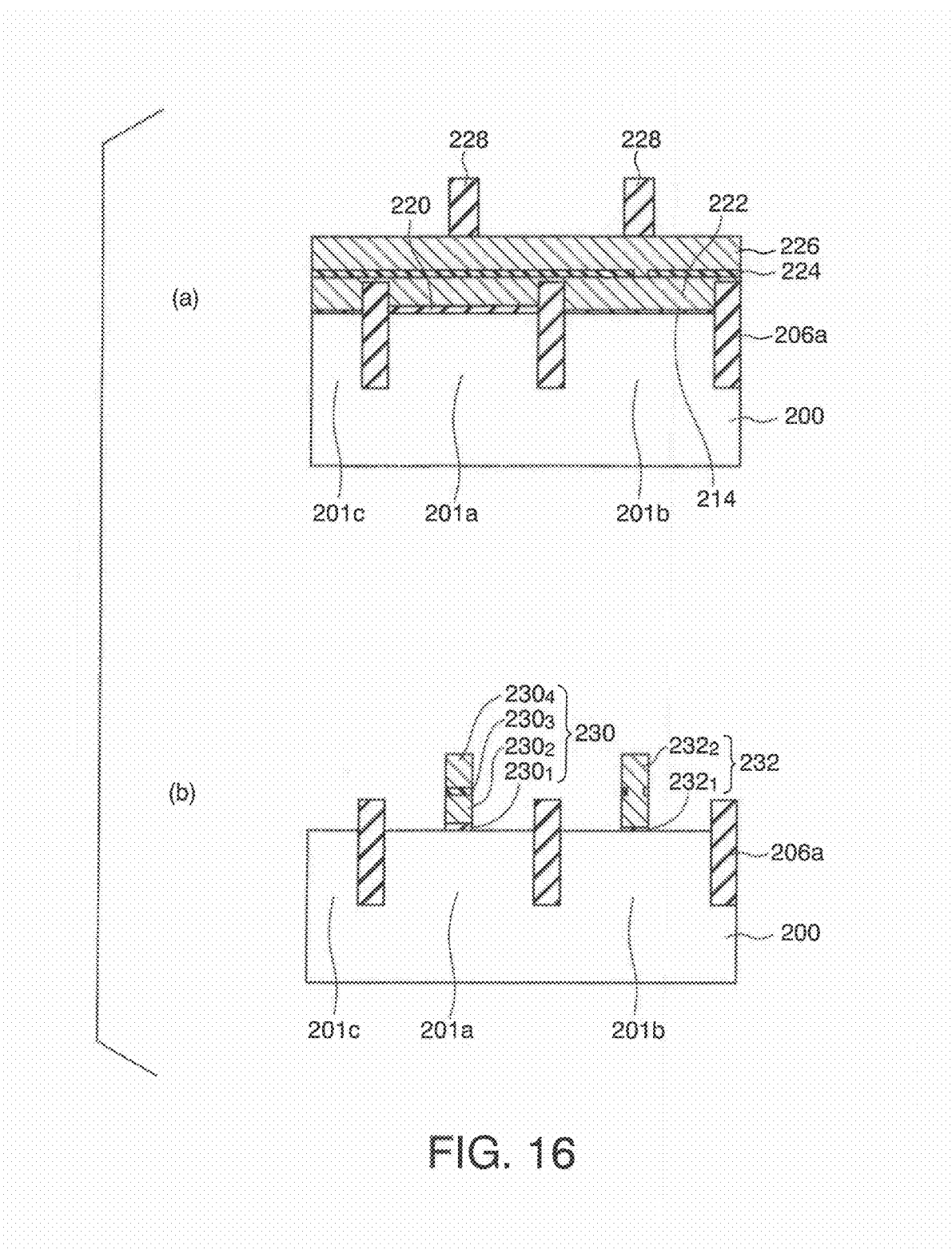
FIGS. 16(a) and 16(b) are cross-sectional views showing procedures for manufacturing the nonvolatile programmable logic switch.
Figure 17:
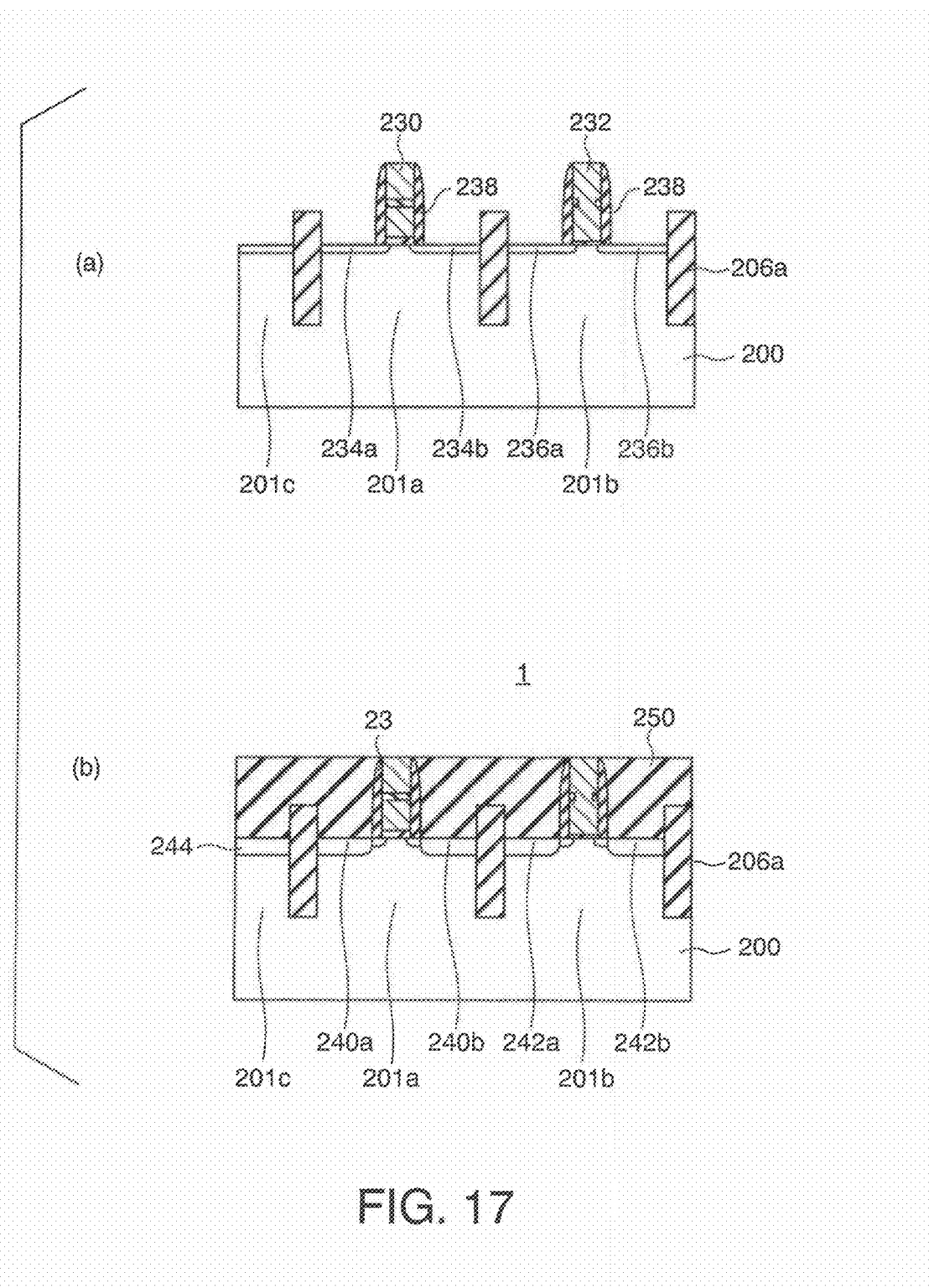
FIGS. 17(a) and 17(b) are cross-sectional views showing procedures for manufacturing the nonvolatile programmable logic switch.

FIG. 11 shows the switching characteristics of the nonvolatile programmable logic switch of this embodiment. In FIG. 11, the abscissa axis indicates the potential $V_{FG}$ of the floating gate 10c$_2$ at a potential $V_{CG}$ of 0 V, and the ordinate axis indicates the drain current flowing in the pass transistor 20 when the potentials of the source region 20a and the drain region 20b of the pass transistor 10 are a potential $V_{DD}$ of 1 V and GND. As shown in FIG. 10, in this embodiment, through a writing operation from an overerased state, the potential $V_{FG}$ of the floating gate 10c$_2$ changes from 1 V to −4.4 V. At this point, the ON/OFF ratio of the pass transistor 20 is represented by a four-digit number, and, from that, it is apparent that the pass transistor 20 functions properly.

As described above, in this embodiment, a nonvolatile programmable logic switch can be realized with two transistors: a memory cell transistor and a pass transistor. Since the number of transistors that are used is smaller than in the conventional arts, higher integration of chips can be realized, and the power consumption per chip can be reduced. Also, the nonvolatile programmable logic switch can be formed with transistors that are smaller in gate length. Accordingly, the entire circuit can be operated at a higher speed than in the conventional arts.

It is well known that, when devices are miniaturized, the device speed is increased, and the costs per chip are lowered.

Figure 18:
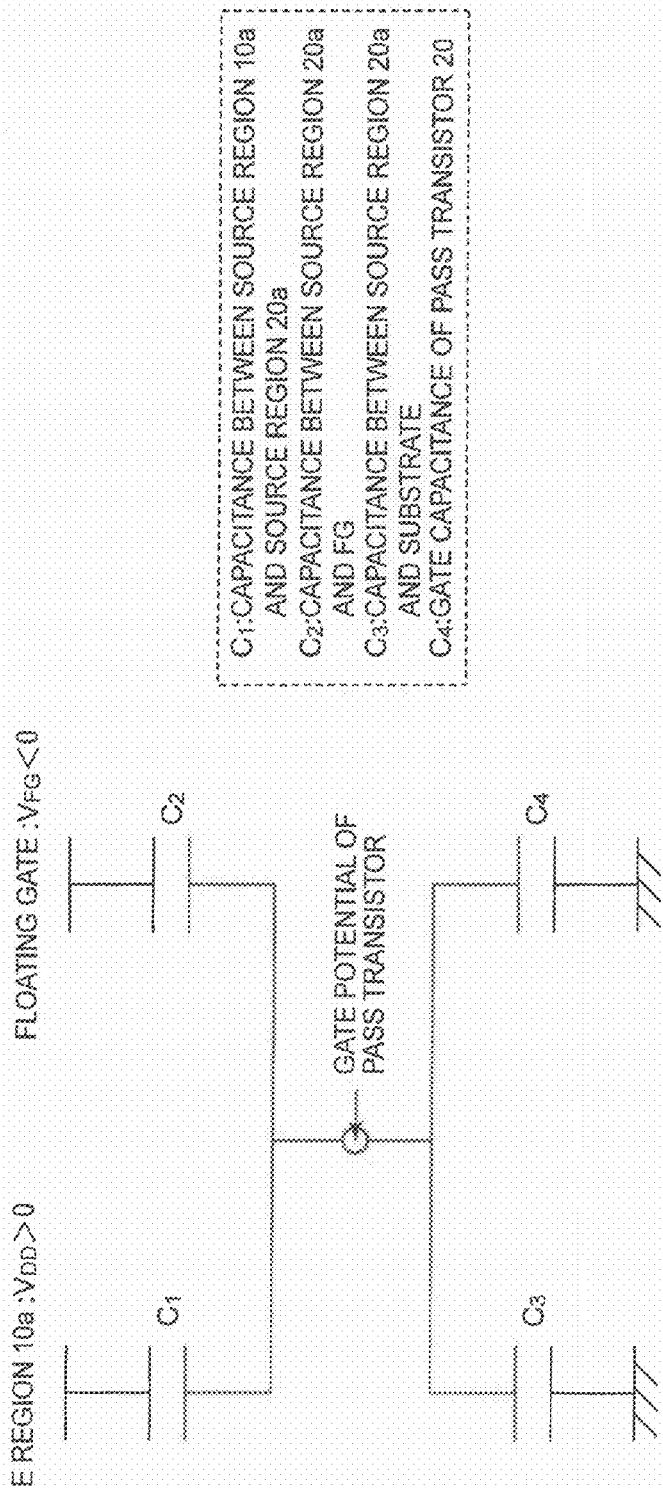
FIG. 18 is an equivalent circuit diagram for explaining that the gate potential of the pass transistor is determined by the capacitive coupling with the potential $V_{DD}$ of the source region of the memory cell transistor, the potential $V_{FG}$ of the floating gate, and the substrate potential.

In addition to that, the pass transistor can be more easily switched off as the device becomes smaller in this embodiment. This can be understood where an electron written state (the memory cell transistor 10 being in an OFF state) is represented by an equivalent circuit. FIG. 18 is an equivalent circuit diagram for explaining that the gate potential of the pass transistor is determined by the capacitive coupling with the potential $V_{DD}$ of the source region 10a of the memory cell transistor 10, the potential $V_{FG}$ of the floating gate, and the substrate potential, or by the capacitance $C_1$ between the source region 10a of the memory cell transistor 10 and the source region 20a of the pass transistor 20, the capacitance $C_2$ between the source region 20a of the pass transistor 20 and the floating gate, the capacitance $C_3$ between the source region 20a of the pass transistor 20 and the substrate, and the gate capacitance $C_4$ of the pass transistor 20. Where the gate lengths are sufficiently long, the influence of the gate capacitance $C_4$ of the pass transistor 20 is dominant, the gate potential of the pass transistor 20 is almost 0 V due to capacitive coupling. Where the gate lengths are small, the capacitive coupling with the capacitance $C_4$ becomes weaker, and the influence of the capacitive coupling between the floating gate and the source region 10a of the memory cell transistor 10 (or the gate of the pass transistor) starts to appear. As a result, the gate potential of the pass transistor 20 shifts in the negative direction, and, even if the potential of the floating gate is the same, the cutoff characteristics of the pass transistor 20 can be improved.

Figure 19:
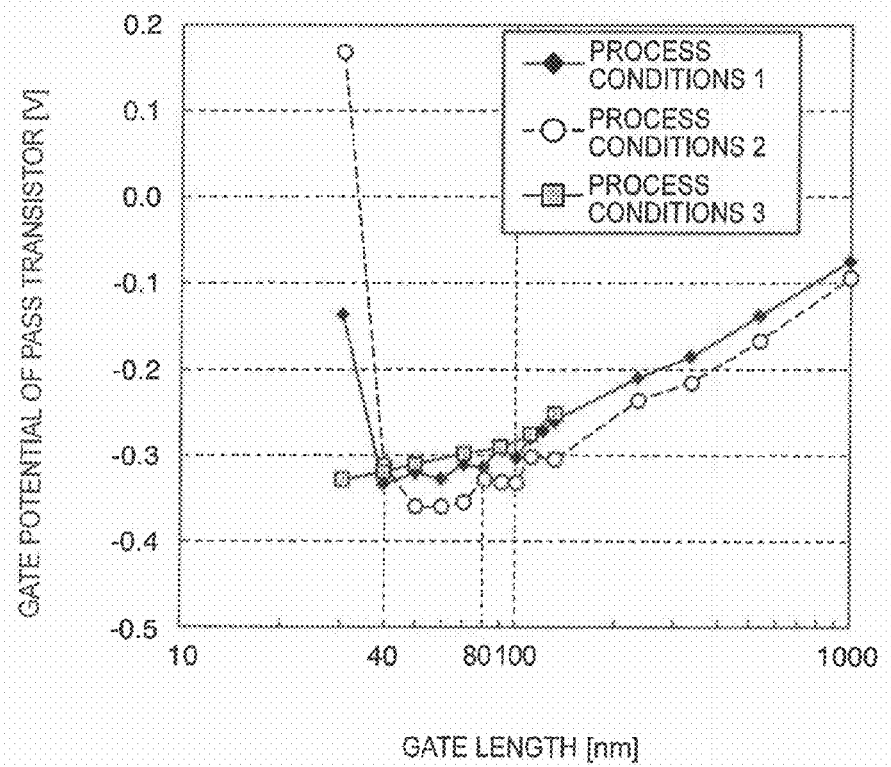
FIG. 19 is a diagram showing the dependence of the gate potential of the pass transistor on the gate length of the pass transistor.

FIG. 19 shows graphs plotting the gate potential of the pass transistor 20 against the gate length of the pass transistor 20 where the potential $V_{FG}$ is −4.5 V. It should be noted that the gate length of the memory cell transistor 10 is the same as that of the pass transistor 20. Process conditions 1 are the results obtained where an impurity concentration in the channel is $2\times10^{18}$ cm$^{-3}$ in the logic switch of this embodiment, and process conditions 2 are the results obtained where the impurity concentration in the channel is $1\times10^{18}$ cm$^{-3}$. As can be seen from the results, the gate potential of the pass transistor 20 becomes lower as the gate lengths are made shorter, and is minimized where the gate lengths are 40 nm to 80 nm.

Under the process conditions 1 and the process conditions 2, the gate potential becomes higher where the gate lengths are made 30 to 40 nm or lower. This is because the potential $V_{DD}$ from the source region 10a of the memory cell transistor 10 is transmitted to the gate electrode of the pass transistor 10 due to a short channel effect of memory cells. However, if different LSA (Laser Spike Anneal) (process conditions 3) from the thermal treatment performed under the process conditions 1 and the process conditions 2 is used, the junction depth can be reduced from 70-100 nm, which is a conventional length, to 20 nm or lower, even if the impurity concentration in the channel is $1\times10^{18}$ cm$^{-3}$, which is the same as that under the process conditions 2. Accordingly, short channel effects can be prevented. With this arrangement, a nonvolatile programmable logic switch in which short channel effects are prevented can be realized, and more preferable characteristics can be achieved with a gate length of 40 nm or smaller as shown in FIG. 19.

Although the memory cell transistor 10 and the pass transistor 20 are n-channel transistors in the above description, the memory cell transistor 10 and the pass transistor 20 can be p-channel transistors. In such a case, the semiconductor substrate 100 is of the n-type, the source region 10a and the drain region 10b of the memory cell transistor 10 are of the p-type, the source region 20a and the drain region 20b of the pass transistor 20 are of the p-type, and the impurity region 8 for terminals is an n$^+$-impurity region. However, the present invention cannot be applied in cases where the channel conductivity types of the memory cell transistor and the pass transistor are different from each other.

In the structure according to this embodiment, the gate lengths of the memory cell transistor and the pass transistor are the same. However, even if the gate length of the memory cell transistor is made longer than that of the pass transistor, more preferable characteristics than those of a conventional SRAM can be maintained in terms of area as long as the gate length of the memory cell transistor is three or less times longer than the gate length of the pass transistor. This is because, a SRAM is normally formed by six transistors, and the transistors are arranged in two rows and three columns.

Referring now to FIGS. 12(a) through 17(b), a method of manufacturing the nonvolatile programmable logic switch of the first embodiment is described. In the following description, a p-type Si substrate of a plane orientation (100) having an impurity concentration of approximately $5\times10^{15}$ cm$^{-3}$ is used. However, the logic switch may be manufactured with the use of a different plane orientation.

First, as shown in FIG. 12(a), a thermal oxide film 202 is formed on a Si substrate 200, and a Si$_3$N$_4$ film 204 and a TEOS (Tetra Ethyl Ortho Silicate) film 206 are formed in this order. To form STIs (Shallow Trench Isolation) to serve as the device isolation regions, a resist is applied, followed by patterning of the resist to form a mask 208 made of the resist. With the use of the mask 208, etching is performed sequentially on the TEOS film 206, the Si$_3$N$_4$ film 204, and the SiO$_2$ film 202, and the Si substrate 200, to form grooves 210 having a depth of approximately 200 nm in the Si substrate 200 as shown in FIG. 12(b). After the resist mask 208 is removed, the TEOS film 206 is again deposited, and is then flattened by CMP (Chemical Mechanical Polishing). As a result, the grooves 210 formed in the Si substrate 200 are filled with the TEOS film 206, as shown in FIG. 12(c).

Next, the Si$_3$N$_4$ film 204 and the SiO$_2$ film 202 are removed by etching, to form STIs 206a, as shown in FIG. 13(a). By the STIs 206a, the Si substrate 200 is divided into a memory cell transistor formation region 201a, a pass transistor formation region 201b, and a terminal formation region 201c for substrate bias application. A sacrifice oxide film 212 is then formed on the surface of the Si substrate 200, and B ions or the like are implanted to form channel impurity profiles, followed by a heat treatment, as shown in FIG. 13(b). If possible, the memory cell transistor and the pass transistor preferably have the same impurity profiles. In some cases, however, different impurity profiles need to be used for the two transistors. In such a case, ions need to be implanted under different conditions in the memory cell transistor formation region 201a and the pass transistor formation region 201b with the use of a mask. According to the manufacturing method of this embodiment, the optimum thicknesses of the gate insulating films of the memory cell transistor and the pass transistor differ from each other. Therefore, a thermal oxide film having a different thickness needs to be formed for each of the memory cell transistor formation region 201a and the pass transistor formation region 201b. After the sacrifice oxide film 212 is removed, a gate insulating film 214 having a film thickness of several nanometers for the pass transistor is first formed (FIG. 13(c)).

A Si$_3$N$_4$ film 216 is then formed to cover the entire surface, and a resist 218 is applied onto the Si$_3$N$_4$ film 216, as shown in FIG. 14(a). Patterning is then performed on the resist 218, to form an opening 218a in the memory cell transistor formation region 201a (FIG. 14(a)). Etching is then performed on the Si$_3$N$_4$ film 216 and the SiO$_2$ film 214, to remove the resist 218. In this manner, only the portions of the Si$_3$N$_4$ film 216 and the gate insulating film 214 located in the memory cell transistor formation region 201a are removed as shown in FIG. 14(b). A gate insulating film 220 having a thickness of approximately 8 nm is then formed in the memory cell transistor formation region 201a, and after that, the resist 218 and the $Si_3N_4$ film 216 are removed by etching. Through such a process, a different gate insulating film for each of the formation regions 201a and 201b can be formed as shown in FIG. 14(c). Although the gate insulating films are assumed to be $SiO_2$ films in this description, the gate insulating films may be high-k films such as silicon nitride films nitrided with NO or $NH_3$, metal oxide films, or metal oxynitride films.

In this embodiment, the memory cell transistor and the pass transistor have different gate electrode structures. That is, the memory cell transistor has a floating gate as well as a control gate, while the pass transistor has only a gate electrode made of polysilicon, for example. Where the following process is used for such a structure, transistors with different gate electrode structures can be formed in a semiconductor region, and the memory cell transistor and the pass transistor do not need to be formed in regions independent of one another. Therefore, the n-well region 106 shown in FIG. 4 becomes unnecessary.

First, a polysilicon film 222 having P (phosphorus) ions or the like implanted therein and an insulating film 224 to be an interelectrode insulating film (a block insulating film) of the memory cell transistor are formed (FIG. 15(a)). The ion-implanted polysilicon film 222 may be formed by implanting ions such as P ions after a polysilicon film is formed. The portion of the interelectrode insulating film 224 on which the gate electrode of the pass transistor is to be formed is removed by etching, to form a groove 224a, as shown in FIG. 15(b). The width of the groove 224a is smaller than the width of the gate of the pass transistor. After that, a polysilicon film 226 having ions such as P ions implanted therein is formed on the entire surface (FIG. 15(c)). As a result, the groove 224a is filled with the polysilicon film 226, and the polysilicon film 226 is connected to the polysilicon film 222 (FIG. 15(c)).

A resist is then applied to the entire surface, and patterning is performed on the resist, to form a pattern 228 for gate formation (FIG. 16(a)). With the pattern 228 serving as a mask, etching is performed on the polysilicon film 226, the insulating film 224, and the polysilicon film 222 in this order. As a result, a gate 230 having a stacked structure in which a tunnel insulating film $230_1$, a floating gate $230_2$, an interelectrode insulating film $230_3$, and a control gate $230_4$ are stacked in this order is formed in the memory cell transistor formation region 201a, and a gate 232 having a stacked structure in which a gate insulating film $232_1$ and a gate electrode $232_2$ are stacked in this order is formed in the pass transistor formation region 201b, as shown in FIG. 16(b). After that, a post-oxidation process is performed. An oxide film region formed as a result of the post-oxidation process is not shown in the drawing. Although the control gate is a polysilicon film according to the above described manufacturing method, the control gate can be a metal film.

Implantations of ions such as arsenic ions or phosphorus ions and a heat treatment are then performed to form n-type impurity regions 234a and 234b in the memory cell transistor formation region 201a and n-type impurity regions 236a and 236b in the pass transistor formation region 201b, as shown in FIG. 17(a). The n-type impurity regions 234a, 234b, 236a, and 236b have impurity concentration peaks in the substrate surface. In some cases, after the n-type impurity regions 234a, 234b, 236a, and 236b are formed, ions of p-type impurities may be implanted into lower portions of the n-type impurity regions 234a, 234b, 236a, and 236b, to form halo regions, so as to prevent short channel effects.

In this embodiment, the width of each STI 102 between the memory cell transistor and the pass transistor shown in FIG. 2 can be made smaller than that in the comparative example illustrated in FIG. 4. In such a structure as that of the comparative example, the width of each STI cannot normally be adjusted to a certain value or smaller to prevent interference between devices. Specifically, the width of each STI needs to be equal to or greater than the sum of the width of the depletion layer formed between the semiconductor region 101a in which the memory cell transistor is formed and the n-well 106, and the width of the depletion layer formed between the semiconductor region 101c in which the pass transistor is formed and the n-well 106. Otherwise, the n-well 106 is completely depleted.

Where Na represents the acceptor concentration in the p-type region, and Nd represents the donor concentration in the n-type region, the width Wdep of each depletion layer formed in the pn junction is expressed as:

$$Wdep = \sqrt{\frac{2\varepsilon_{Si}(N_a + N_d)\psi_m}{qN_aN_d}}$$

Here, $\varepsilon_{Si}$ represents the dielectric constant of Si, q represents the elementary charge, and $\psi_m$ represents the sum (16 V) of the junction potential (1 V, for example) in the pn junction and the erase voltage 15 V. In the comparative example, even if depletion layers extend from the STIs on both sides, the depletion layers should not be in contact with each other. Therefore, the width Wsti of each STI is required to satisfy the following relationship:

$$Wsti > 3 * Wdep$$

The coefficient "3" of the right-hand side is a coefficient for preventing contact between depletion layers even if the depletion layers extend from both sides. The coefficient needs to be at least larger than 2, and is 3 in this example for safety reasons. The acceptor and donor concentrations in the vicinities of STIs are normally $1 \times 10^{17}$ cm$^{-3}$ to $1 \times 10^{18}$ cm$^{-3}$. Therefore, Wsti is calculated to be 2 μm in the comparative example.

On the other hand, the STIs between the memory cell transistor and the pass transistor in this embodiment are expected to electrically insulate the diffusion layer 10b of the memory cell transistor and the diffusion layer 20a of the pass transistor from each other. Therefore, the width of each STI should be the minimum processing size or greater (100 nm or greater, for example). To make the entire logic switch compact and reduce the size of the entire logic switch, the width of each STI is preferably 500 nm or smaller.

An insulating film such as a TEOS film is then deposited, and RIE is performed on the insulating film, to form gate sidewalls 238 from the TEOS film on the side portions of the gates 230 and 232 (FIG. 17(a)). The gate sidewalls may not be made from the TEOS film, but may be formed from another insulating film such as a $Si_3N_4$ film. Also, each of the gate sidewalls 238 may not be a single-layer structure, but may be formed with two or more insulating films such as a TEOS film and a $Si_3N_4$ film.

A mask material such as a resist then masks only the terminal formation region 201c, and impurity ions such as arsenic ions or phosphorus ions are implanted, to form n$^+$-impurity regions 240a and 240b having an impurity concentration of $1 \times 10^{19}$ cm$^{-3}$ to $1 \times 10^{20}$ cm$^{-3}$ in the memory cell transistor formation region 201a, and n$^+$-impurity regions 242a and 242b having an impurity concentration of $1\times10^{19}$ cm$^{-3}$ to $1\times10^{20}$ cm$^{-3}$ in the pass transistor formation region 201b. After that, the memory cell transistor formation region 201a and the pass transistor formation region 201b are masked, and p-type impurities such as B (boron) are implanted into the terminal formation region 201c, to form a p$^+$-impurity region 244 to be a terminal for applying a substrate bias. An interlayer insulating film 250 is then formed on the entire surface, and interconnects (not shown) are formed, to complete the logic switch 1 of this embodiment as shown in FIG. 17(b).

It should be noted that, in the logic switch of this embodiment manufactured as described above, the substrate profiles and diffusion layer profiles of the memory cell transistor and the pass transistor are basically the same. However, as long as the memory cell transistor and the pass transistor are formed with the same p-wells, ion implantation may be performed separately with different masks, and no problems arise if the profiles differ.

As described above, according to this embodiment, a logic switch is formed with a memory cell transistor and a pass transistor, and accordingly, the size can be minimized. Also, the memory cell transistor and the pass transistor can be formed on the same semiconductor substrate or in the same semiconductor region through a conventional semiconductor process.

(Second Embodiment)

Figure 20:
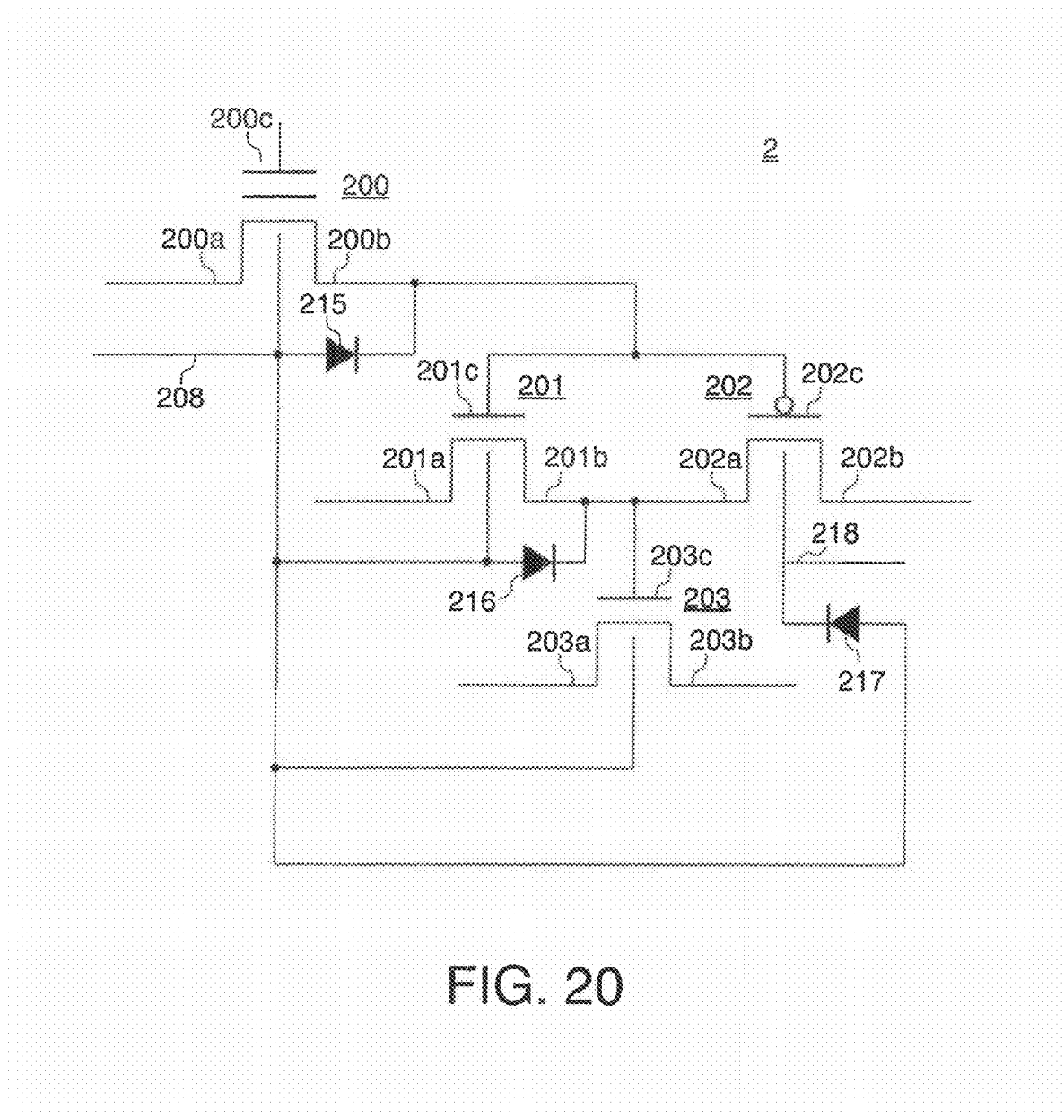
FIG. 20 is a circuit diagram of a logic switch according to a second embodiment.
Figure 21:
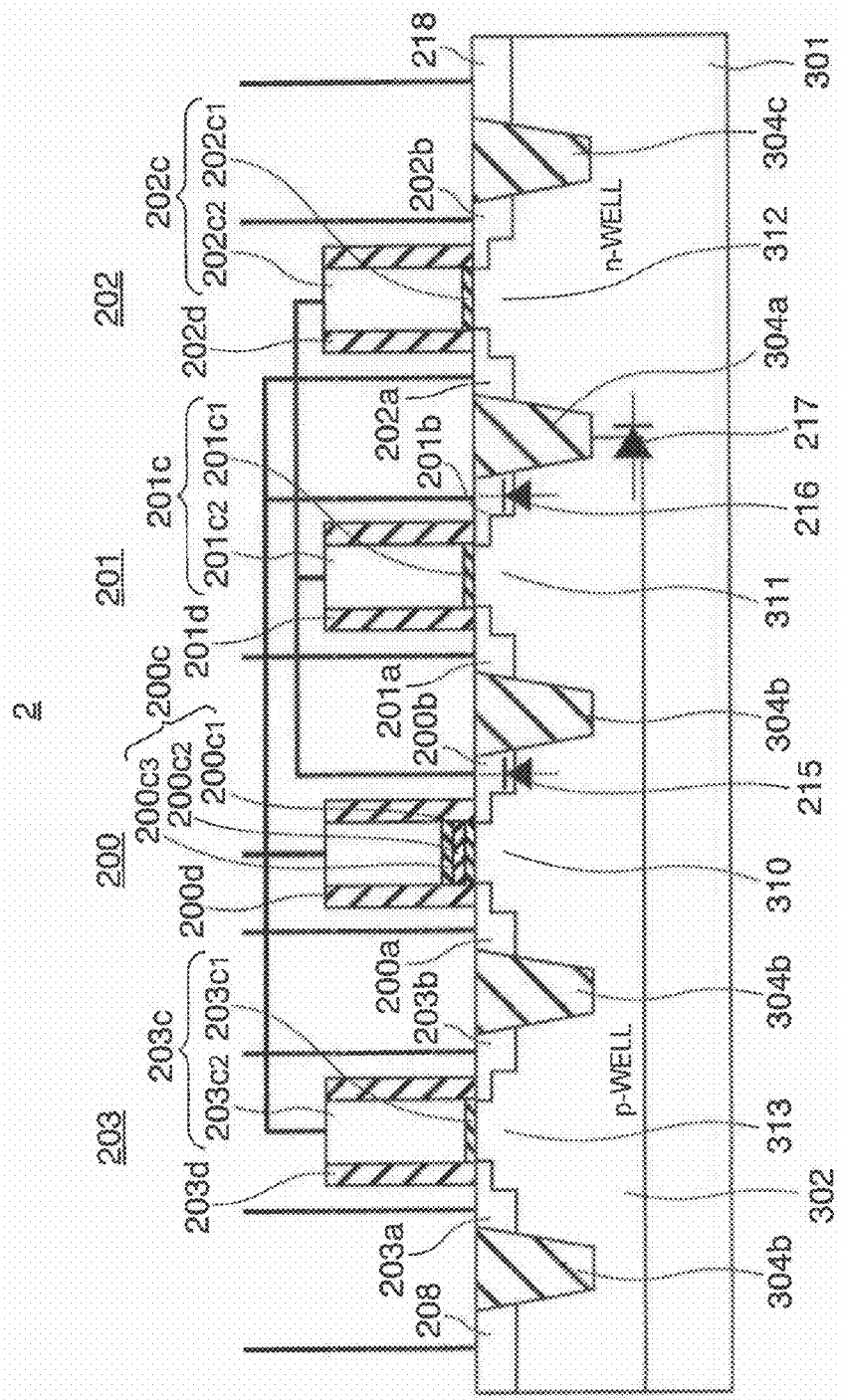
FIG. 21 is a cross-sectional view of the logic switch according to the second embodiment.

Next, a logic switch according to a second embodiment of the present invention is described. FIG. 20 is a circuit diagram of the logic switch of this embodiment, and FIG. 21 is a cross-sectional view of the logic switch. The logic switch 2 of this embodiment is formed on a semiconductor layer that includes an n-well region 301 and a p-well region 302. In FIG. 20, the p-well region 302 is adjacent to the n-well region 301, and is separated from the n-well region 301 by a device isolation region 304a. The logic switch 2 of this embodiment includes an electrode 208, a memory cell transistor 200, an n-channel MOS transistor 201, and an n-type pass transistor 203 that are formed in the p-well region 302, and a p-channel MOS transistor 202 and an electrode 218 that are formed in the n-well region 301. The electrode 208, the memory cell transistor 200, the n-channel MOS transistor 201, and the n-type pass transistor 203 are separated from one another by device isolation regions 304b. The p-channel MOS transistor 202 and the electrode 218 are separated from each other by a device isolation region 304c. Explanation of aspects that are the same as those of the first embodiment will not be repeated herein. The n-channel MOS transistor 201 and the p-channel MOS transistor 202 are connected in series.

As shown in FIG. 20, a drain electrode 200b of the memory cell transistor 200 is electrically connected to a gate electrode 201c of the n-channel MOS transistor 201 and a gate electrode 202c of the p-channel MOS transistor 202. A drain electrode 201b of the n-channel MOS transistor 201 and a source electrode 202a of the p-channel MOS transistor 202 are both electrically connected to a gate electrode 203c of the pass transistor 203.

The electrode 208 formed with a p$^+$-diffusion layer is formed in the p-well region 302, and a substrate bias can be applied to the p-well region 302 through the electrode 208. The n-well region 301 and the p-well region 302 that are adjacent to each other form a pn junction 217. Meanwhile, the electrode 218 formed with an n$^+$-diffusion layer is formed in the n-well region 301, and the substrate bias can be applied to the n-well region 301. When a positive bias is applied to the electrode 218, the pn junction 217 is in a reverse bias condition. Therefore, the potential is not transmitted to the p-well region 302, and the positive bias can be applied only to the n-well region 301. The gate electrode 201c of the n-channel MOS transistor 201 and the gate electrode 202c of the p-channel MOS transistor 202 are electrically connected to the electrode 208 through a pn junction 215 formed by the drain electrode 200b of the memory cell transistor 200 and the p-well region 302. Likewise, the gate electrode 203c of the pass transistor 203 is electrically connected to the electrode 208 through a pn junction 216.

As shown in FIG. 21, the memory cell transistor 200 includes an n$^+$-type source region 200a and a drain region 200b that are formed at a distance from each other in a semiconductor region 310 in the p-well region 302. The memory cell transistor 200 further includes a gate 200c having a stacked structure in which a tunnel insulating film $200c_1$, a charge storage film $200c_2$, a block insulating film $200c_3$, and a control gate $200c_4$ are stacked in this order on the semiconductor region 310 to be the channel between the source region 200a and the drain region 200b. This embodiment differs from the first embodiment in that the charge storage film $200c_2$ includes a charge trapping film including a nitride film, for example. That is, the memory cell transistor 200 has a MONOS (Metal-Oxide-Nitride-Oxide-Semiconductor) gate structure. Sidewalls 200d made of an insulating material are formed on the side portions of the gate 200c. The semiconductor region 310 and the drain region 200b form the pn junction 215.

The n-channel MOS transistor 201 includes an n$^+$-type source region 201a and a drain region 201b that are formed at a distance from each other in a semiconductor region 311 in the p-well region 302. The n-channel MOS transistor 201 further includes a gate 201c having a stacked structure in which a gate insulating film $201c_1$ and a gate electrode $201c_2$ are stacked in this order on the semiconductor region 311 to be the channel between the source region 201a and the drain region 201b. Sidewalls 201d made of an insulating material are formed on the side portions of the gate 201c. The semiconductor region 311 and the drain region 201b form the pn junction 216.

The p-channel MOS transistor 202 includes a p$^+$-type source region 202a and a drain region 202b that are formed at a distance from each other in a semiconductor region 312 in the n-well region 301. The p-channel MOS transistor 202 further includes a gate 202c having a stacked structure in which a gate insulating film $202c_1$ and a gate electrode $202c_2$ are stacked in this order on the semiconductor region 312 to be the channel between the source region 202a and the drain region 202b. Sidewalls 202d made of an insulating material are formed on the side portions of the gate 202c. The n-well region 301 and the p-well region 302 form the pn junction 217 below the device isolation region 304a.

The n-channel MOS transistor 203 includes an n$^+$-type source region 203a and a drain region 203b that are formed at a distance from each other in a semiconductor region 313 in the p-well region 302. The n-channel MOS transistor 203 further includes a gate 203c having a stacked structure in which a gate insulating film $203c_1$ and a gate electrode $203c_2$ are stacked in this order on the semiconductor region 313 to be the channel between the source region 203a and the drain region 203b. Sidewalls 203d made of an insulating material are formed on the side portions of the gate 203c. It should be noted that the electrode 208 has the same structure as the electrode 8 of the first embodiment.

Figure 22:
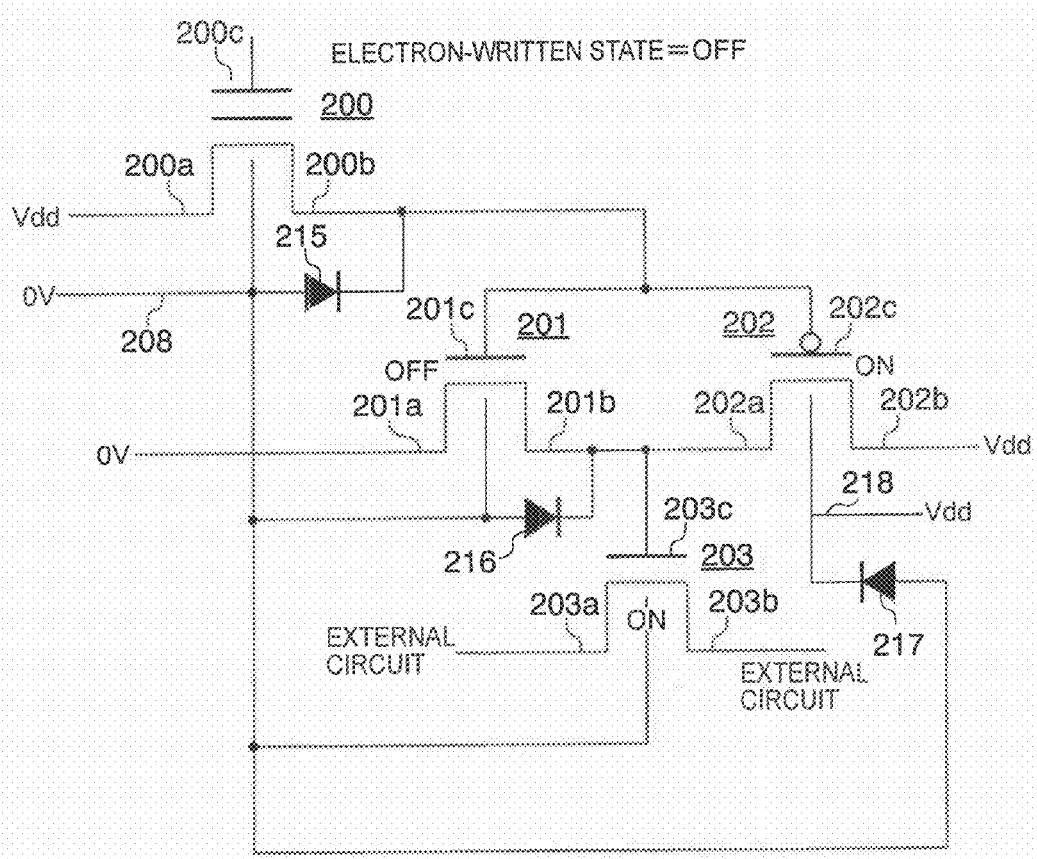
FIG. 22 is a diagram showing a written state of a logic switch according to the second embodiment.
Figure 23:
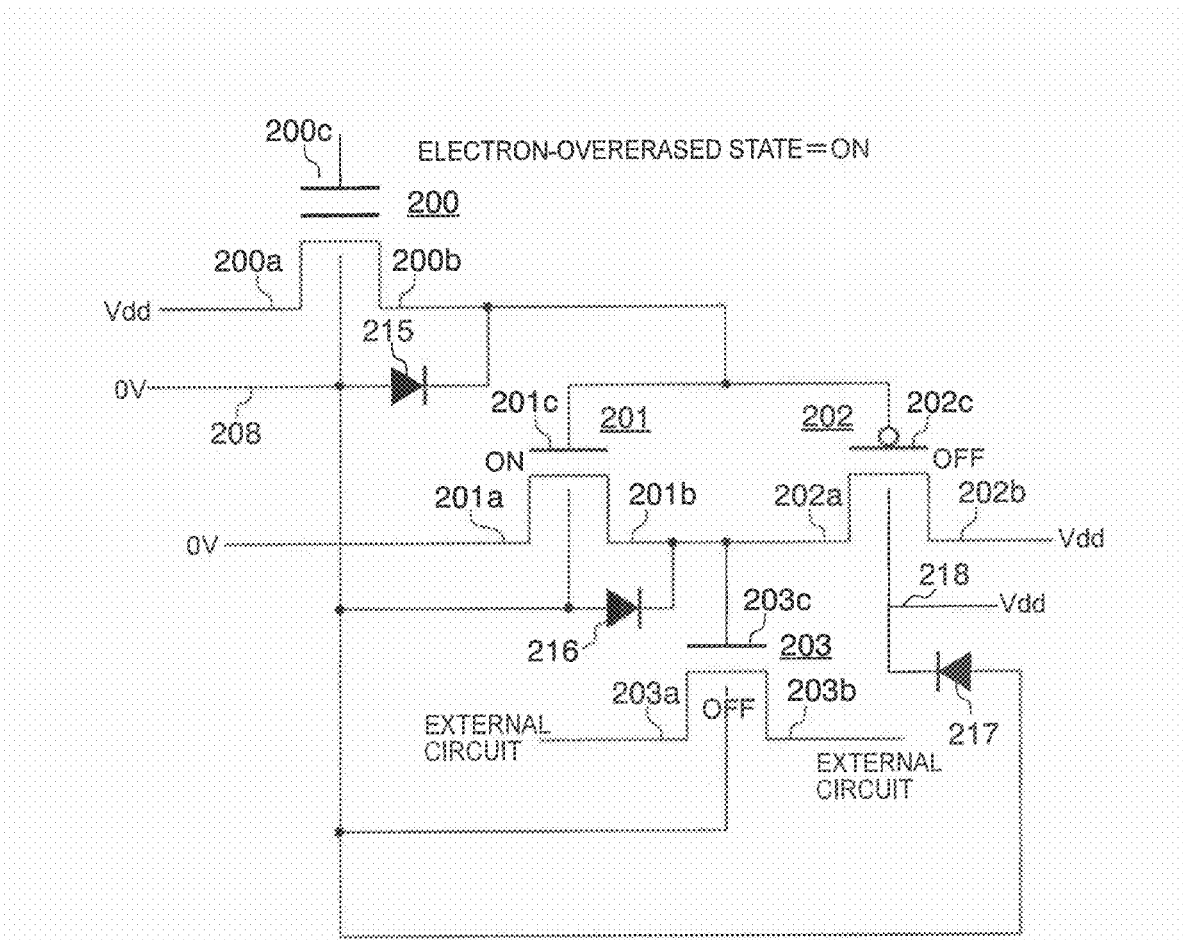
FIG. 23 is a diagram showing a written state of a logic switch according to the second embodiment.

Next, a switching operation in the logic switch 2 of this embodiment is described. First, a source voltage Vdd is applied to the source electrode 200a of the memory cell transistor 200, and 0 V (the ground voltage) and the source voltage Vdd are applied to the drain electrode 201b of the n-channel MOS transistor 201 and the source electrode 202b of the p-channel MOS transistor 202, respectively. The electrode 208 for applying the substrate bias to the p-well region 302 is grounded. A positive bias (such as Vdd) is applied to the electrode 218, so that the p-channel MOS transistor 202 performs a switching operation within a voltage range of 0 to Vdd.

Where electrons have been written into the charge storage layer of the memory cell transistor 200 (FIG. 22), the memory cell transistor 200 is in an OFF state. Therefore, the gate electrode 201c of the n-channel MOS transistor 201 and the gate electrode 202c of the p-channel MOS transistor 202 are electrically cut off from the source region 200a of the memory cell transistor 200, and the source voltage Vdd is not applied to those gate electrodes 201c and 202c. In this situation, the potentials of the gate electrodes 201c and 202c in an equilibrium state becomes 0 V, which is the same as the potential of the substrate. The n-channel MOS transistor 201 is put into an OFF state, and the p-channel MOS transistor 202 is put into an ON state. As the p-channel MOS transistor 202 is put into an ON state, the source voltage Vdd is applied to the gate electrode 203c of the pass transistor 203, as well as to the drain electrode 202b of the p-channel MOS transistor 202, and the pass transistor 203 is put into an ON state. The potential of the gate electrode 203c of the n-channel MOS transistor 203 is stabilized at the source voltage Vdd through the drain electrode 202b of the p-channel MOS transistor 202. As a result, the influence of high-frequency signals from external circuits on the pass transistor 203 can be made smaller than in the first embodiment, and the reliability of the circuit operation becomes higher.

Where the charge storage layer of the memory cell transistor 200 is in an overerased state (FIG. 23), the memory cell transistor 200 is in an ON state. Therefore, the gate electrode 201c of the n-channel MOS transistor 201 and the gate electrode 202c of the p-channel MOS transistor 202 are electrically connected to the source electrode 200a of the memory cell transistor 200, and the source voltage Vdd is applied to those gate electrodes. Accordingly, the n-channel MOS transistor 201 is put into an ON state, and the p-channel MOS transistor 202 is put into an OFF state. Like the source electrode 201a of the n-channel MOS transistor 201, the gate electrode 203c of the pass transistor 203 is grounded, and the pass transistor 203 is put into an OFF state.

Figure 24:
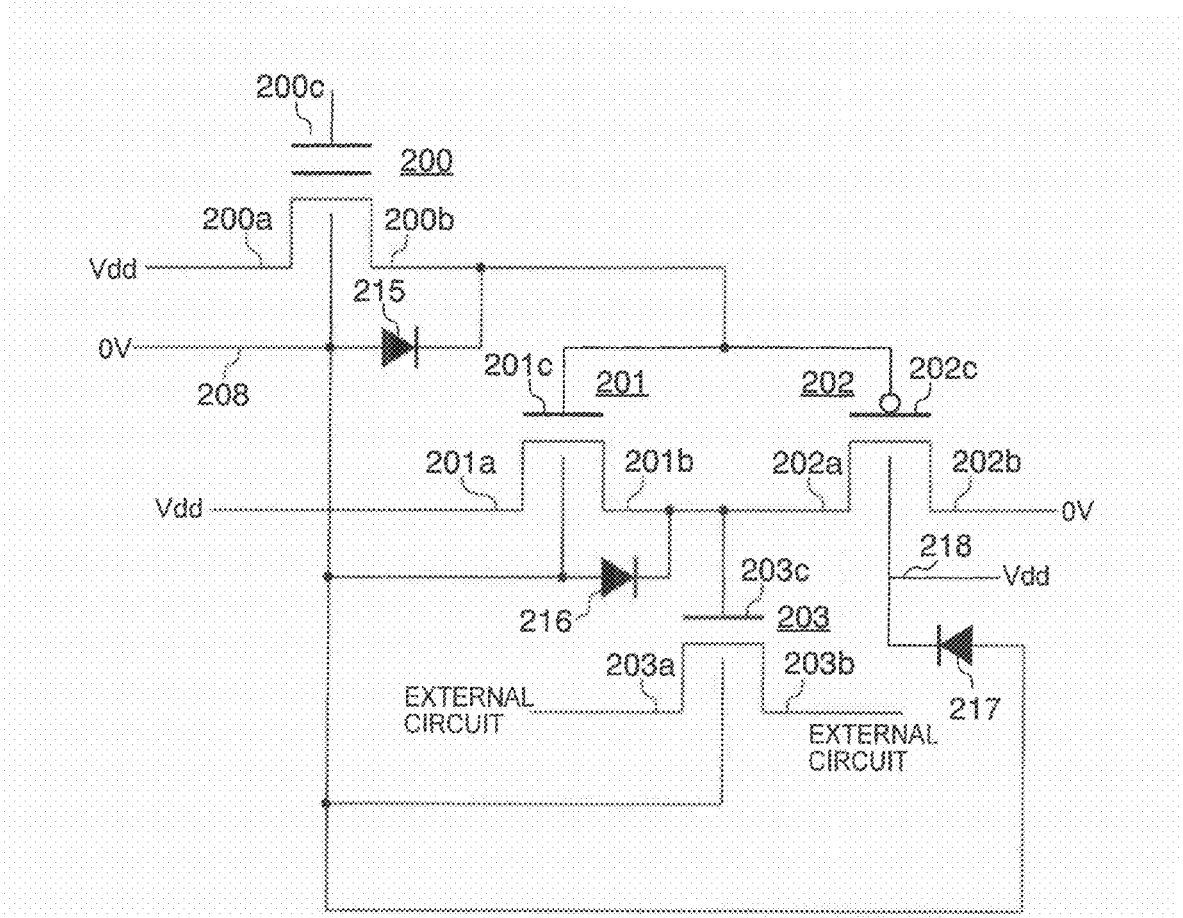
FIG. 24 is a circuit diagram of a logic switch according to a modification of the second embodiment.

In the above description, the source electrode 201a of the n-channel MOS transistor 201 is grounded, and the source voltage Vdd is electrically connected to the drain electrode 202b of the p-channel MOS transistor 202. This is a so-called inverter structure. Therefore, the ON/OFF state of the memory cell transistor 200 is the opposite of the ON/OFF state of the pass transistor 203. However, the source electrode 201a of the n-channel MOS transistor 201 can be electrically connected to the source voltage Vdd, and the drain electrode 202b of the p-channel MOS transistor 202 may be grounded, as shown in FIG. 24. This is a so-called repeater structure. With this structure, the ON/OFF state of the memory cell transistor 200 can be the same as the ON/OFF state of the pass transistor 203.

Next, a write or erase method is described. When writing is performed on the memory cell transistor 200, the source electrode 200a of the memory cell transistor 200 and the substrate bias electrode 208 are grounded as in the first embodiment, and a high voltage (20 V, for example) is applied to the gate electrode 200c of the memory cell transistor 200, to inject electrons from a channel 310 into the charge storage layer $200c_2$ of the memory cell transistor 200. Where writing is performed on another memory cell transistor that shares a voltage source with the gate electrode 200c of the memory cell transistor 200 (or where writing is not to be performed on the memory cell transistor 200), the source electrode 200a of the memory cell transistor 200, the source electrode 201a of the n-channel MOS transistor 201, the drain electrode 202b of the p-channel MOS transistor 202, and the substrate bias electrode 208 are put into a floating state. When a high voltage is input to the drain electrode 200c of the memory cell transistor 200, the potential of the p-well region 302 is increased by the gate-substrate capacitance. Since the n-channel MOS transistor 201 and the pass transistor 203 share the p-well region, the substrate potentials of those transistors also become higher. However, the gate electrode 201c of the n-channel MOS transistor 201 and the gate electrode 203c of the pass transistor 203 are electrically connected to the p-well region by the pn junctions 215 and 216, respectively. Since a forward voltage is applied to the pn junctions 215 and 216 (the p-side having the higher potential), the gate electrode 201c and the gate electrode 203c have the same potentials as that of the substrate, and the gate insulating films are protected.

As for the p-channel MOS transistor 202, a high voltage is applied to the gate electrode 202c through the pn junction 215, but the n-well region 301 is made to have the same potential by the pn junction 217. As a result, the gate insulating film is protected. In a case where the p-well region and the n-well region are not adjacent to each other, and the pn junction 217 does not exist, the same high potential as that applied to the gate electrode 200c of the memory cell transistor 200 may be applied to the drain electrode 202b of the p-channel MOS transistor 202, to protect the gate insulating film of the p-channel MOS transistor 202. Alternatively, a high potential may be applied to the substrate bias electrode 218 on the n-well region 301, to protect the gate insulating film of the p-channel MOS transistor 202.

To perform erasing on the memory cell transistor 200, the gate electrode 200c is grounded at 0 V. After the other electrodes are put into a floating state, a high voltage is applied to the substrate bias electrode 208, to pull out electrons from the charge storage layer of the memory cell transistor 200. At this point, erasing is performed on all the memory cells that share the same well (collective block erasing).

Figure 25:
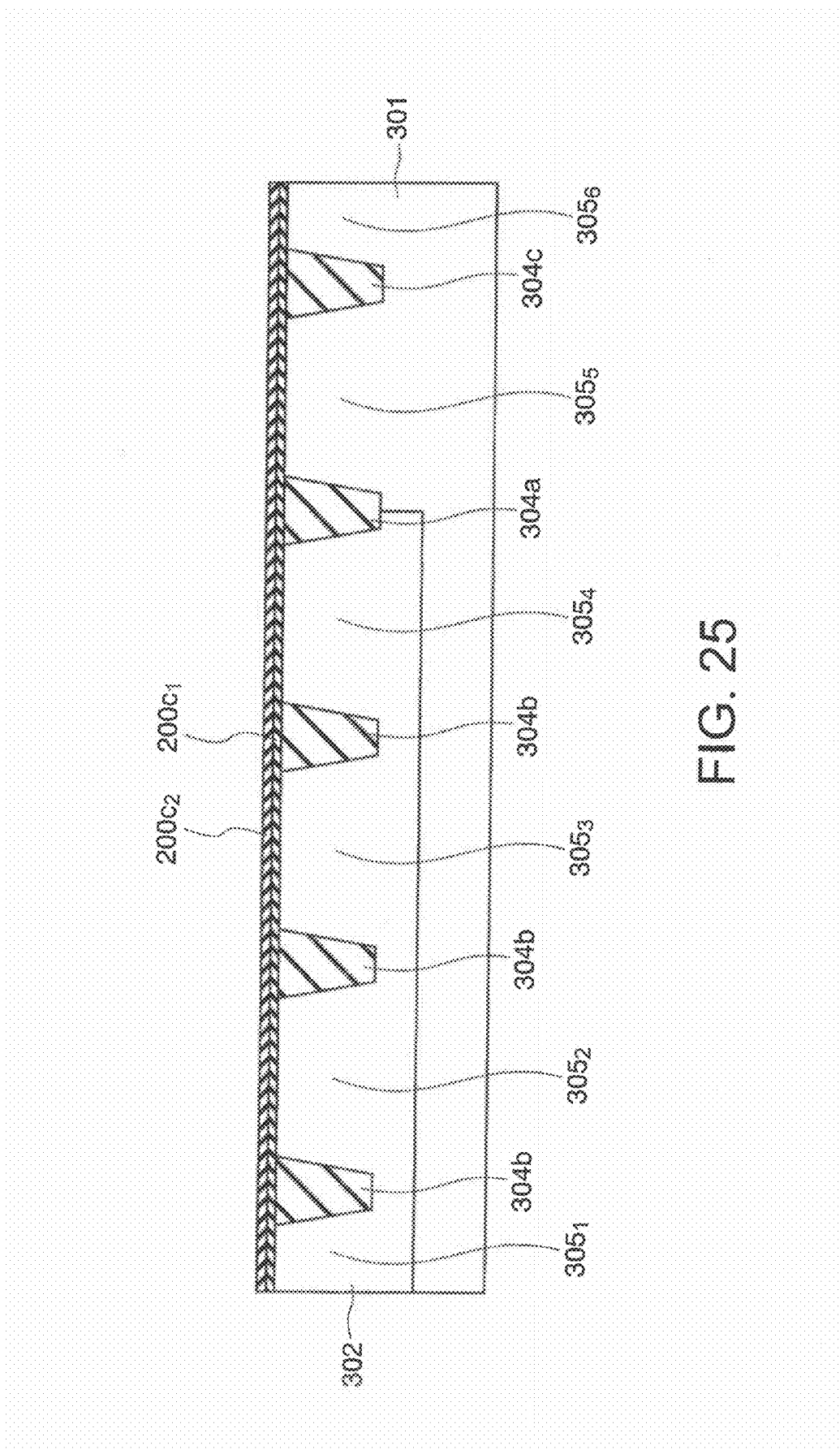
FIG. 25 is a cross-sectional view showing a method for manufacturing the logic switch according to the second embodiment.

Referring now to FIGS. 25 through 31, a method of manufacturing the logic switch of the second embodiment is described. A p-type Si substrate 300 is prepared as in the first embodiment, and the device isolation regions 304a, 304b, and 304c having STI structures for separating devices from one another are formed as in the first embodiment. Accordingly, the six regions of first through sixth device regions $305_1$ through $305_6$ that are separated from one another are formed on the substrate 300 (FIG. 25). After a sacrifice oxide film (not shown) is formed on the surface of the substrate 300, the fifth and sixth device regions $305_5$ and $305_6$ are covered with a mask such as a resist, and p-type impurities such as B are implanted into the first through fourth device regions $305_1$ through $305_4$. As a result, the p-well 302 and the channel profile of the p-channel MOS transistor are formed. By using a lithography technique or the like as needed, impurities can be implanted into the first device region $305_1$ to form the substrate contact, the second device region $305_2$ to form the pass transistor, the third device region $305_3$ to form the memory cell transistor, and the fourth device region $305_4$ to form the NMOS transistor under different injection conditions from one another (FIG. 25).

The first through fourth device regions $305_1$ through $305_4$ are then covered with a mask such as a resist (not shown), and donor ions such as P ions or As ions are implanted into the fifth and sixth device regions $305_5$ and $305_6$, to form the n-well region 301 (FIG. 25). Donor ions such as As ions or P ions are then implanted, to form the channel profile of the p-channel MOS transistor (FIG. 25). After the mask and the sacrifice oxide film are removed, a $SiO_2$ film having a film thickness of approximately several nanometers is formed as the tunnel insulating film $200c_1$, and a SiN film having a film thickness of approximately several nanometers is further formed as the charge trap film $200c_2$ (FIG. 25).

Figure 26:
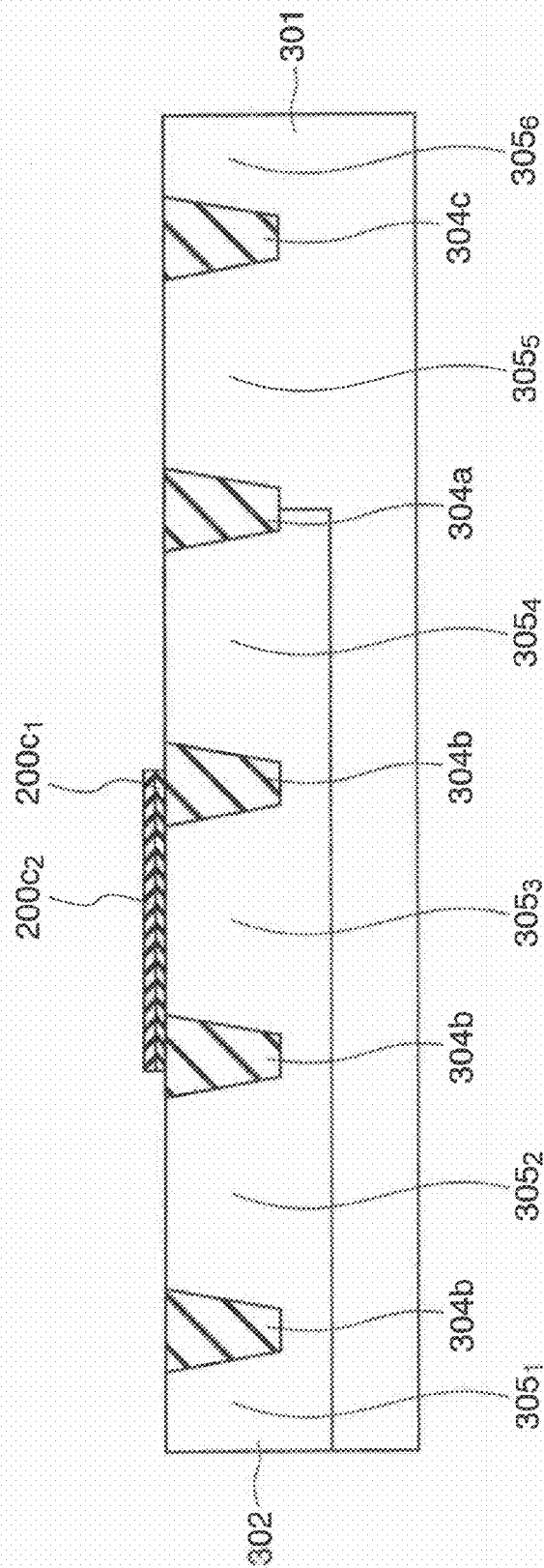
FIG. 26 is a cross-sectional view showing a method for manufacturing the logic switch according to the second embodiment.

Only the third device region $305_3$ is then covered with a mask such as a resist (not shown), and the SiN film $200c_2$ and the $SiO_2$ film $200c_1$ on the first, second, fourth, fifth, and sixth device regions $305_1$, $305_2$, $350_4$, $305_5$, and $305_6$ are removed by RIE, for example (FIG. 26). As a result of this, only the tunnel insulating film $200c_1$ and the charge trap film $200c_2$ remain only on the third device region $305_3$.

Figure 27:
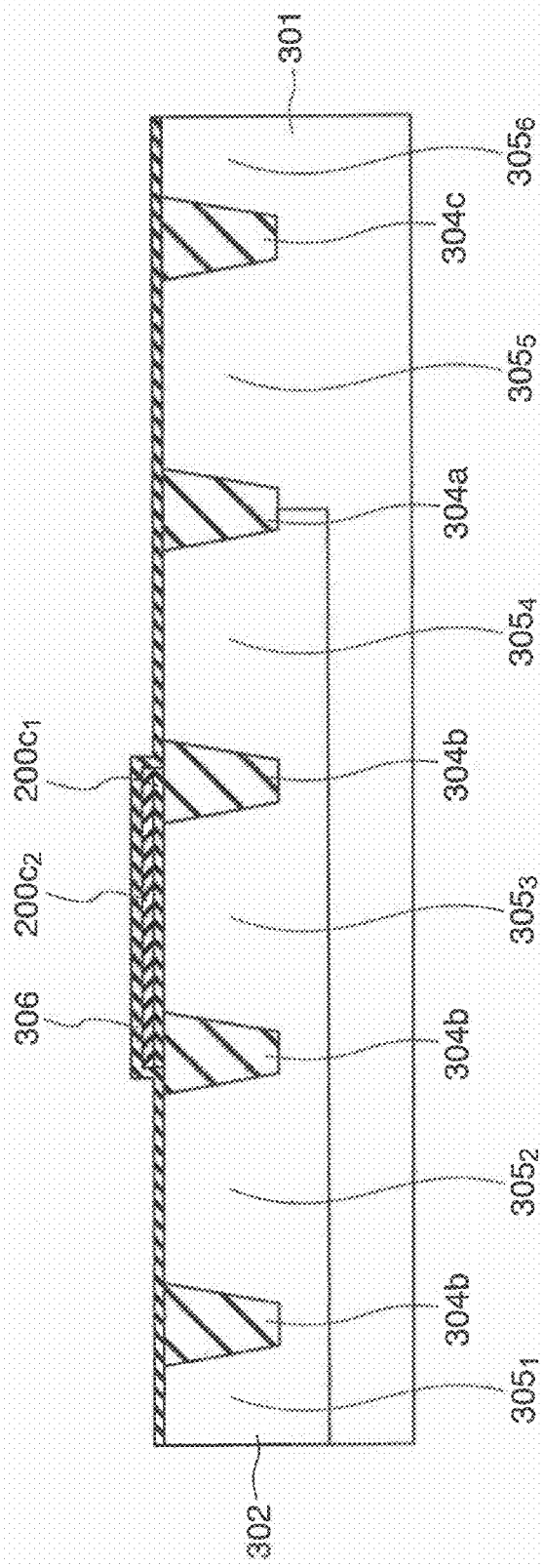
FIG. 27 is a cross-sectional view showing a method for manufacturing the logic switch according to the second embodiment.

After the mask (not shown) on the third device region $305_2$ is removed, an insulating film (such as a $SiO_2$ film) 306 of approximately several nanometers is formed as the gate insulating film or the block insulating film on the entire surface (FIG. 27). That is, a stacked structure formed by the $SiO_2$ film 306, the SiN film $200c_2$, and the $SiO_2$ film $200c_1$, which are to be the block film 306, the charge trap film $200c_2$, and the tunnel insulating film $200c_1$, is formed on the third device region $305_3$, and only the $SiO_2$ film 306 to be the gate insulating film is formed on the second, fourth, and fifth device regions $305_2$, $305_4$, and $305_5$.

Figure 28:
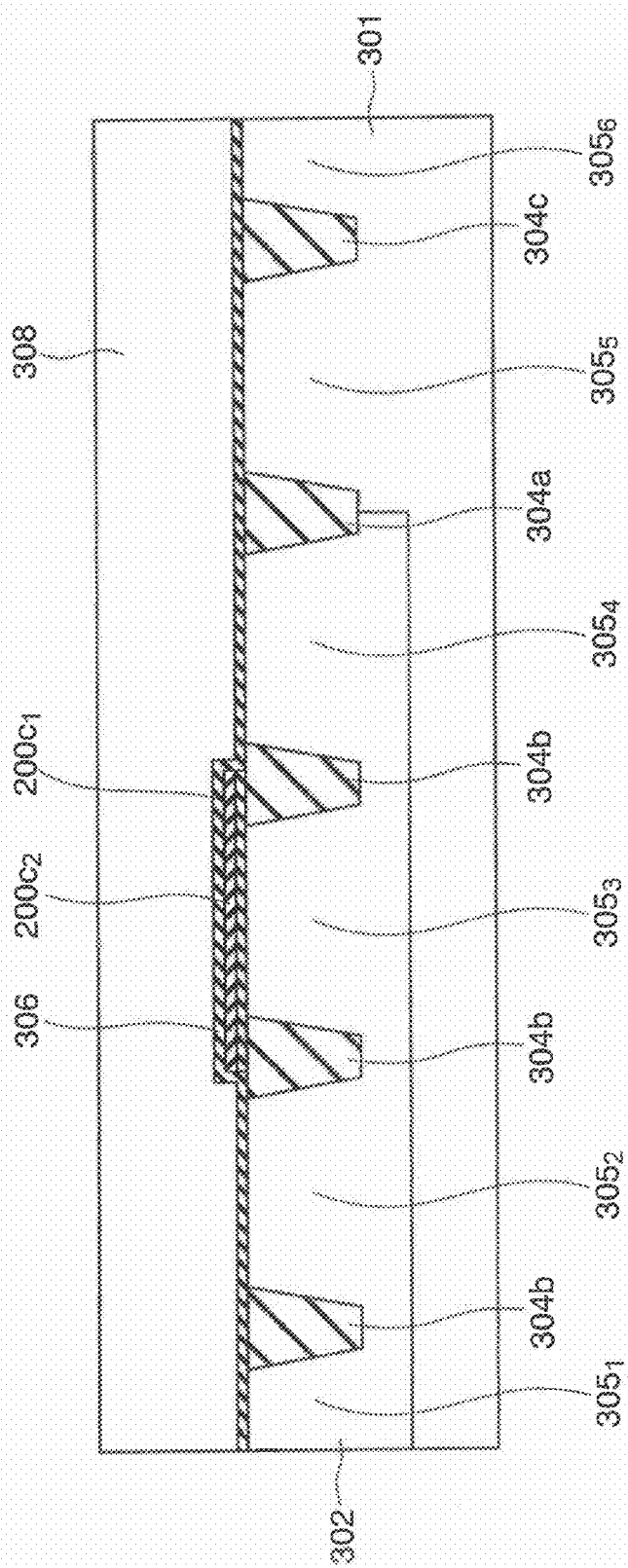
FIG. 28 is a cross-sectional view showing a method for manufacturing the logic switch according to the second embodiment.
Figure 29:
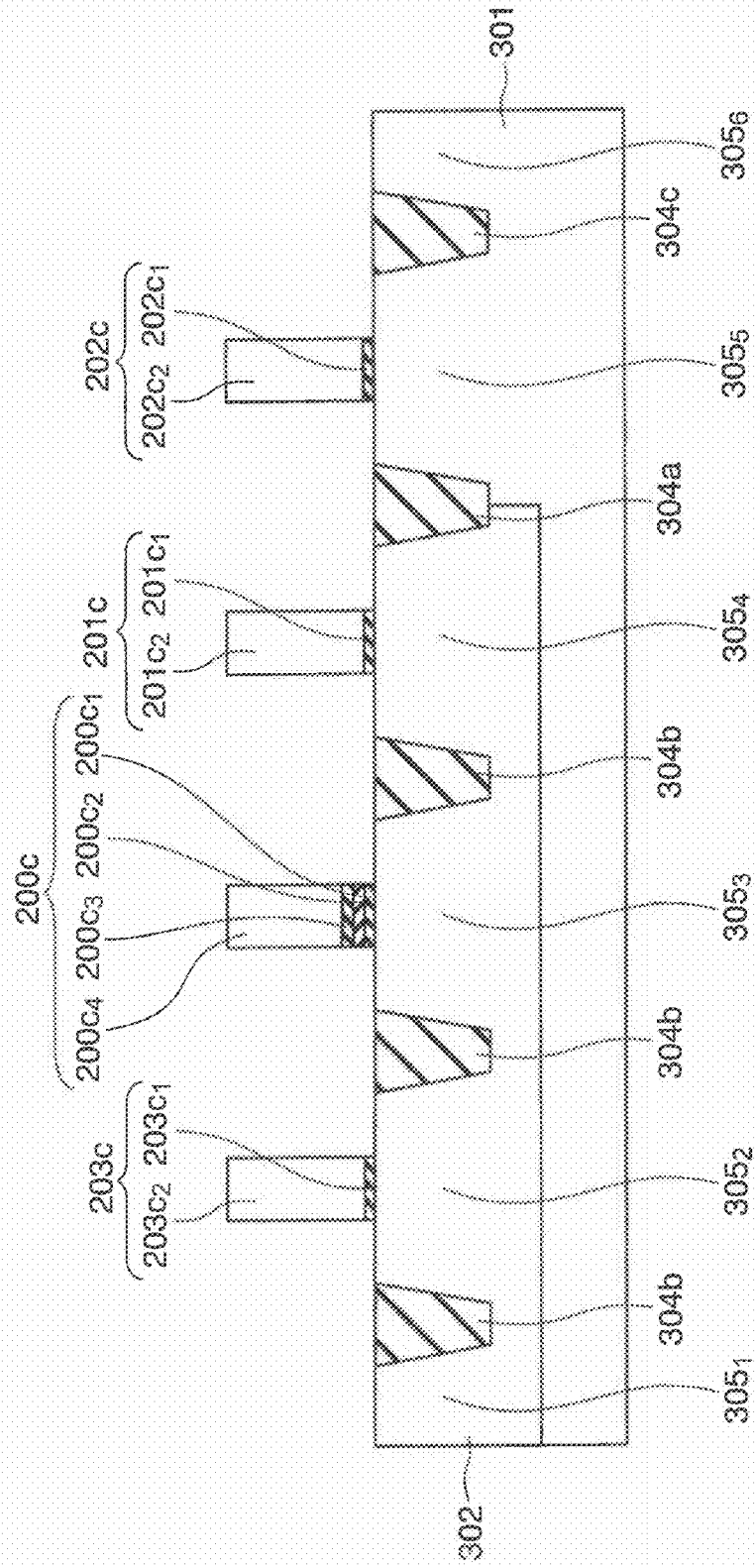
FIG. 29 is a cross-sectional view showing a method for manufacturing the logic switch according to the second embodiment.

A polysilicon film 308 is then formed as a gate electrode material, for example (FIG. 28). The gate electrode material may be a metal thin film other than a polysilicon film, for example. A resist is applied to the entire surface, and patterning is performed on the polysilicon film 308 and the $SiO_2$ film 306 by a lithography technique and a RIE (Reactive Ion Etching) technique. Patterning is further performed on the SiN film $200c_2$ and the $SiO_2$ film $200c_1$. In this manner, the gates $203c$, $200c$, $201c$, and $202c$ are formed on the second through fifth device regions $305_2$ through $305_5$ (FIG. 29). That is, the gate $203c$ is formed on the second device region $305_2$, and has a stacked structure formed by the gate insulating film $203c_1$ and the polysilicon gate electrode $203c_2$. The gate $200c$ is formed on the third device region $305_3$, and has a stacked structure formed by the $SiO_2$ tunnel insulating film $200c_1$, the SiN charge trap film $200c_2$, the $SiO_2$ block insulating film $200c_3$, and the polysilicon gate electrode $200c_4$. The gate $201c$ is formed on the fourth device region $305_4$, and has a stacked structure formed by the $SiO_2$ gate insulating film $201c_1$ and the polysilicon gate electrode $201c_2$. The gate $202c$ is formed on the fifth device region $305_5$, and has a stacked structure formed by the $SiO_2$ gate insulating film $202c_1$ and the polysilicon gate electrode $202c_2$.

Figure 30:
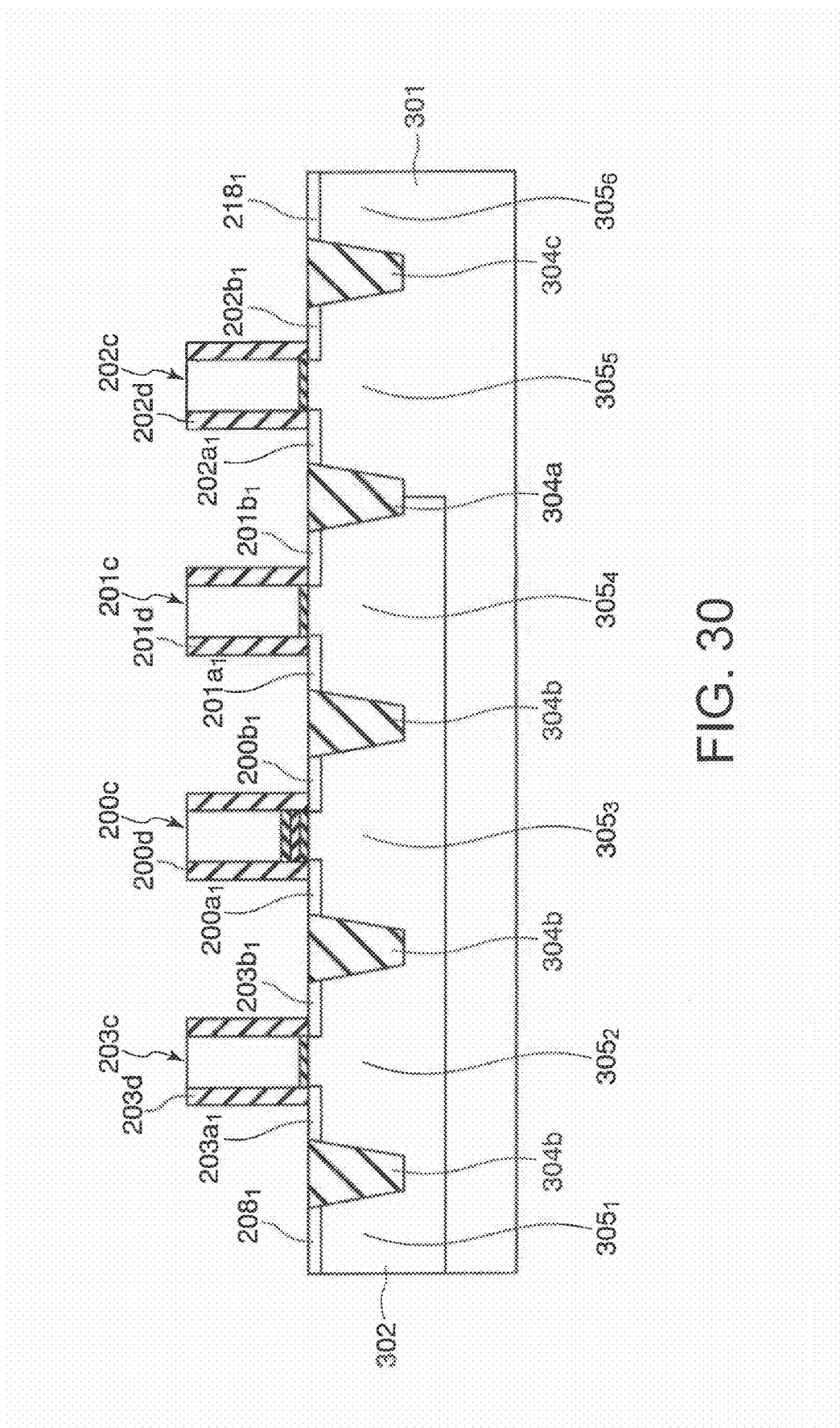
FIG. 30 is a cross-sectional view showing a method for manufacturing the logic switch according to the second embodiment.

The first and fifth device regions $305_1$ and $305_5$ are then covered with a mask (not shown) such as a resist, and a donor such as As is implanted into the polysilicon films, the source/drain regions, and the electrodes for bias application on the second through fourth device regions $305_2$ through $305_4$ and the sixth device region $305_6$. As a result of this, n-type impurity regions $203a_1$ and $203b_1$ having a small junction depth are formed in the second device region $305_2$, n-type impurity regions $200a_1$ and $200b_1$ having a small junction depth are formed in the third device region $305_3$, n-type impurity regions $201a_1$ and $201b_1$ having a small junction depth are formed in the fourth device region $305_4$, and an n-type impurity region $218_1$ having a small junction depth is formed in the sixth device region $305_6$ (FIG. 30). At this point, halos can be formed to prevent short channel effects. Halo formation is a known technique to form impurity regions of different conductivity type from the source and the drain inside and under source/drain diffusion regions. Also, by using a lithography technique or the like, ions can be implanted into the second through fourth device regions $305_2$ through $305_4$ and the sixth device region $305_6$ under different conditions from each other.

The mask on the first and fifth device regions $305_1$ and $305_5$ is then removed, and the second through fourth device regions $305_2$ through $305_4$ and the sixth device region $305_6$ are covered with a mask such as a resist. An acceptor such as B is then implanted into the substrate contact region of the first device region $305_1$ and the polysilicon film and the source/drain regions of the fifth device region $305_5$. As a result of this, a p-type impurity region $208_1$ having a small junction depth is formed in the first device region $305_1$, and p-type impurity regions $202a_1$ and $202b_1$ having a small junction depth are formed in the fifth device region $305_5$ (FIG. 30). At this point, acceptor implantation can be performed on the first device region $305_1$ and the fifth device region $305_5$ separately from each other by a lithography technique or the like, and a halo can be formed in the fifth device region $305_5$ to prevent short channel effects.

The mask on the second through fourth device regions $305_2$ through $305_4$ and the sixth device region $305_6$ are then removed, and the gate sidewalls $203d$, $200d$, $201d$, and $202d$ made of an insulating material are formed on the side portions of the gates $203c$, $200c$, $201c$, and $202c$ (FIG. 30).

Figure 31:
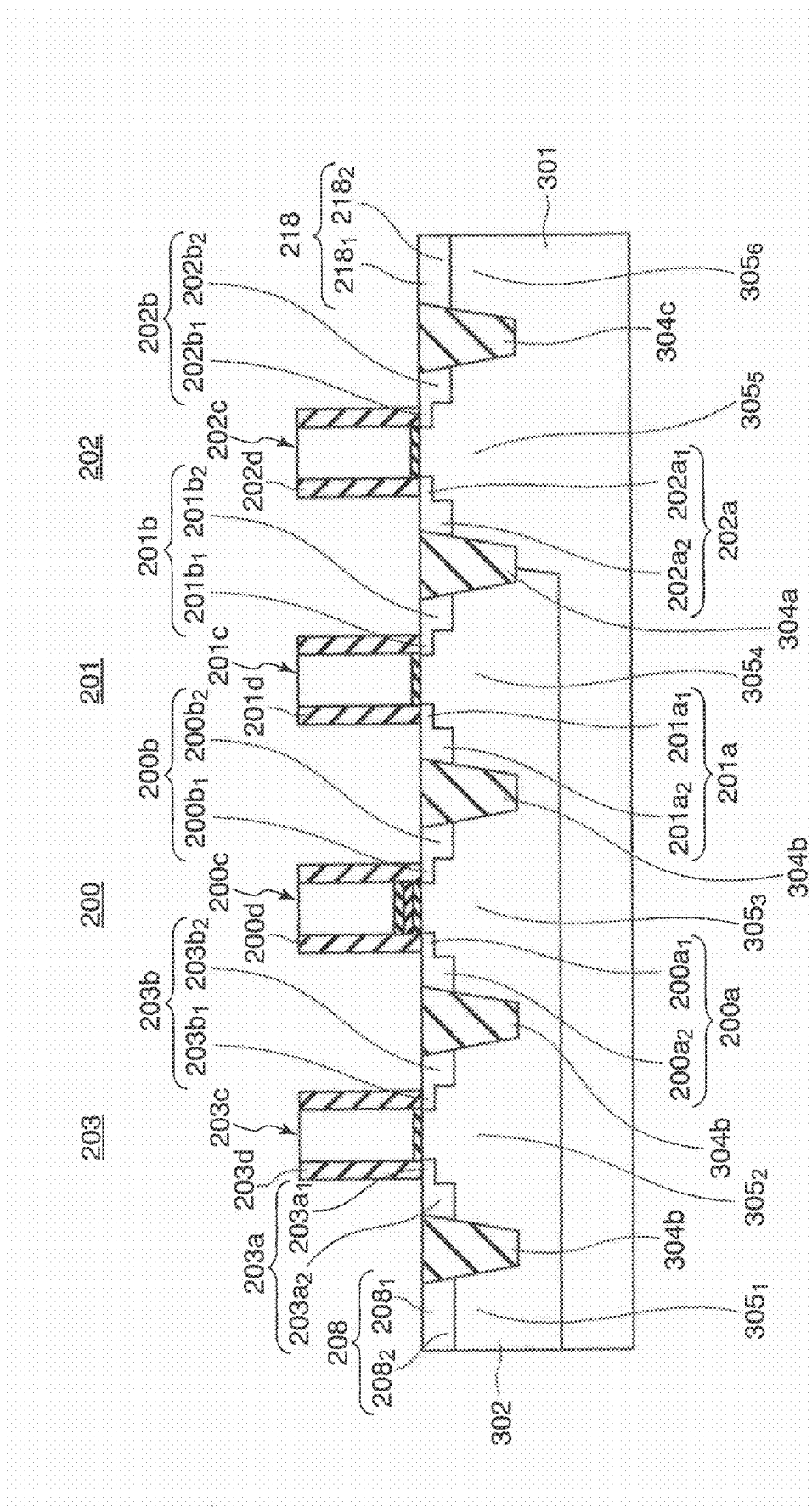
FIG. 31 is a cross-sectional view showing a method for manufacturing the logic switch according to the second embodiment.

After that, the first and fifth device regions $305_1$ and $305_5$ are covered with a mask (not shown) such as a resist, and deep donor ions are implanted into the terminal formation regions of the second through fourth device regions $305_2$ through $305_4$ and the sixth device region $305_6$. As a result of this, n-type impurity regions $203a_2$ and $203b_2$ having a large junction depth are formed in the second device region $305_2$, n-type impurity regions $200a_2$ and $200b_2$ having a large junction depth are formed in the third device region $305_3$, n-type impurity regions $201a_2$ and $201b_2$ having a large junction depth are formed in the fourth device region $305_4$, and an n-type impurity region $218_2$ having a large junction depth is formed in the sixth device region $305_6$ (FIG. 31). The impurity regions $203a_1$ and $203a_2$ become the source region $203a$ of the n-channel transistor 203, and the impurity regions $203b_1$ and $203b_2$ become the drain region $203b$ of the n-channel transistor 203. Also, the impurity regions $200a_1$ and $200a_2$ become the source region $200a$ of the n-channel transistor 200, and the impurity regions $200b_1$ and $200b_2$ become the drain region $200b$ of the n-channel transistor 200. Further, the impurity regions $201a_1$ and $201a_2$ become the source region $201a$ of the n-channel transistor 201, and the impurity regions $201b_1$ and $201b_2$ become the drain region $201b$ of the n-channel transistor 201. The n-type impurity regions $218_1$ and $218_2$ become the electrode 218 (FIG. 31). After that, the mask covering the first and fifth device regions $305_1$ and $305_5$ is removed.

The second through fourth device regions $305_2$ through $305_4$ and the sixth device region $305_6$ are then covered with a mask (not shown) such as a resist, and deep acceptor ions are implanted into the terminal formation regions of the first and fifth device regions $305_1$ and $305_5$. As a result of this, an p-type impurity region $208_2$ having a large junction depth is formed in the first device region $305_1$, and p-type impurity regions $202a_2$ and $202b_2$ having a large junction depth are formed in the fifth device region $305_5$ (FIG. 31). The p-type impurity regions $208_1$ and $208_2$ become the terminal 208, the impurity regions $202a_1$ and $202a_2$ become the source region $202a$ of the p-channel transistor 202, and the impurity regions $202b_1$ and $202b_2$ become the drain region $202b$ of the p-channel transistor 202 (FIG. 31). After that, the mask is removed, and a heat treatment for impurity activation is performed as needed (FIG. 31). A nickel thin film of approximately 10 nm in thickness, for example, is then formed on the entire surface as needed, and a heat treatment for silicidation may be performed to form a silicide electrode in each terminal formation region. An interlayer insulating film is then formed on the entire surface, and interconnects are formed, to complete the logic switch of the second embodiment illustrated in FIG. 21.

According to the manufacturing method of the second embodiment, the MONOS memory cell transistor and the other transistors can be collectively manufactured, and the processing steps can be reduced.

Although the embodiments of the present invention have been described so far through specific examples, those specific examples are merely examples and do not limit the present invention. Also, the embodiments can be applied to one another. For example, each memory cell is of a FG type in the first embodiment, and is of a MONOS type in the second embodiment. However, a MONOS type may be used in the first embodiment, and a FG type may also be used in the second embodiment. Other than that, any logic switches that contain the components of the present invention and can be arbitrarily modified by those skilled in the art are included within the scope of the invention.

The invention claimed is:

1. A nonvolatile programmable logic switch comprising:
a device isolation region formed in a semiconductor substrate;
first and second semiconductor regions of a first conductivity type, the first and second semiconductor regions being formed in the semiconductor substrate and being separated from each other by the device isolation region;
a memory cell transistor including:
a first source region and a first drain region of a second conductivity type, the first source region and the first drain region being formed at a distance from each other in the first semiconductor region;
a first insulating film formed on a portion of the first semiconductor region, the portion being located between the first source region and the first drain region;
a charge storage film formed on the first insulating film;
a second insulating film formed on the charge storage film; and
a control gate formed on the second insulating film;
a pass transistor including:
a second source region and a second drain region of the second conductivity type, the second source region and the second drain region being formed at a distance from each other in the second semiconductor region;
a third insulating film formed on a portion of the second semiconductor region, the portion being located between the second source region and the second drain region; and
a gate electrode formed on the third insulating film, the gate electrode being electrically connected to the first drain region; and
an electrode for applying a substrate bias to the first and second semiconductor regions, the electrode being formed in the semiconductor substrate.

2. The logic switch according to claim 1, wherein
the second source region and the second drain region are electrically connected to different external circuits from each other,
the first source region is electrically connected to a drive source, and
the pass transistor becomes conductive, based on a charge storage state in the charge storage film of the memory cell transistor.

3. The logic switch according to claim 1, wherein a gate length of the memory cell transistor is 3L or less, where L represents a gate length of the pass transistor.

4. The logic switch according to claim 1, wherein a width of the device isolation region is 100 nm to 500 nm.

5. The logic switch according to claim 1, wherein a gate length of the pass transistor is 40 nm to 80 nm.

6. The logic switch according to claim 1, wherein the charge storage film includes a floating gate.

7. The logic switch according to claim 1, wherein the charge storage film includes a charge trapping film.

8. The logic switch according to claim 1, wherein when an erasing operation of the memory cell transistor is performed, the electrode is connected to a power supply which generates an erasing voltage.

9. A nonvolatile programmable logic switch comprising:
a device isolation region formed in a semiconductor substrate;
first and second semiconductor regions of a first conductivity type, the first and second semiconductor regions being formed in the semiconductor substrate and being separated from each other by the device isolation region;
a memory cell transistor including:
a first source region and a first drain region of a second conductivity type, the first source region and the first drain region being formed at a distance from each other in the first semiconductor region;
a first insulating film formed on a portion of the first semiconductor region, the portion being located between the first source region and the first drain region;
a charge storage film formed on the first insulating film;
a second insulating film formed on the charge storage film; and
a control gate formed on the second insulating film;
a pass transistor including:
a second source region and a second drain region of the second conductivity type, the second source region and the second drain region being formed at a distance from each other in the second semiconductor region;
a third insulating film formed on a portion of the second semiconductor region, the portion being located between the second source region and the second drain region; and
a gate electrode formed on the third insulating film; and
an electrode for applying a substrate bias to the first and second semiconductor regions, the electrode being formed in the semiconductor substrate; and
a transistor of the first conductivity type and a transistor of the second conductivity type, the transistors being connected in series through a connection node,
wherein the first drain region is electrically connected to gate electrodes of the transistors of the first and second conductivity types, and the gate electrode of the pass transistor is electrically connected to the connection node between the transistors of the first and second conductivity types.

10. The logic switch according to claim 9, further comprising
a third semiconductor region of the first conductivity type and a fourth semiconductor region of the second conductivity type, the third semiconductor region and the fourth semiconductor region being separated from each other by the device isolation region, wherein the fourth semiconductor region and one of the first through third semiconductor regions form a pn junction below the device isolation region, and the transistor of the first conductivity type is formed in the fourth semiconductor region, and the transistor of the second conductivity type is formed in the third semiconductor region.

11. The logic switch according to claim 10, further comprising an electrode for applying a substrate bias to the fourth semiconductor region, the electrode being formed in the semiconductor substrate.

12. A nonvolatile programmable logic switch comprising:
a memory cell transistor including:
 a first source region and a first drain region of a first conductivity type, the first source region and the first drain region being formed at a distance from each other in a first semiconductor region of a semiconductor substrate, the first semiconductor region being of a second conductivity type different from the first conductive type;
 a first insulating film formed on a portion of the first semiconductor region, the portion being located between the first source region and the first drain region;
 a charge storage film formed on the first insulating film;
 a second insulating film formed on the charge storage film; and
 a control gate formed on the second insulating film;
a pass transistor including a gate electrode and formed in a second semiconductor region of the semiconductor substrate, the gate electrode being electrically connected to the first drain region; and
an electrode for applying a substrate bias to the first and second semiconductor regions.

13. The logic switch according to claim 12, wherein the charge storage film includes a floating gate.

14. The logic switch according to claim 12, wherein the charge storage film includes a charge trapping film.

* * * * *